(12) United States Patent
Vishwanath et al.

(10) Patent No.: US 11,929,755 B2
(45) Date of Patent: Mar. 12, 2024

(54) PIECEWISE COMPENSATION FOR VOLTAGE REFERENCE TEMPERATURE DRIFT

(71) Applicant: TEXAS INSTRUMENTS INCORPORATED, Dallas, TX (US)

(72) Inventors: Tallam Vishwanath, Bangalore (IN); Sandeep Shylaja Krishnan, Pin (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 221 days.

(21) Appl. No.: 17/513,984

(22) Filed: Oct. 29, 2021

(65) Prior Publication Data
US 2023/0101413 A1 Mar. 30, 2023

(30) Foreign Application Priority Data

Aug. 29, 2021 (IN) .............................. 202141039096

(51) Int. Cl.
| | | |
|---|---|---|
| H03M 1/06 | (2006.01) | |
| G05F 1/46 | (2006.01) | |
| G05F 1/567 | (2006.01) | |
| H03M 1/08 | (2006.01) | |
| G05F 3/30 | (2006.01) | |

(52) U.S. Cl.
CPC ............ *H03M 1/089* (2013.01); *G05F 1/468* (2013.01); *G05F 1/567* (2013.01); *G05F 3/30* (2013.01)

(58) Field of Classification Search
CPC ........ H03M 1/089; G05F 1/468; G05F 1/567; G05F 3/30
See application file for complete search history.

(56) References Cited

U.S. PATENT DOCUMENTS 11,088,699 B1    8/2021   Vishwanath et al.
11,514,862 B2 *  11/2022  Kim .................... H03F 3/45475

OTHER PUBLICATIONS

International Search Report dated Dec. 12, 2022.

* cited by examiner

*Primary Examiner* — Joseph J Lauture
(74) *Attorney, Agent, or Firm* — Charles F. Koch; Frank D. Cimino

(57) ABSTRACT

This description relates generally to piecewise temperature compensation. In an example, a circuit includes a knee code selector that can be configured to set a knee point temperature for a correction current responsive to a respective knee point temperature code of knee point temperature codes and a respective temperature sense signal of temperature sense signals. The circuit includes an output circuit that can be configured to provide the correction current responsive to the respective temperature sense signal and temperature voltages, and a trim digital to analog converter (DAC) that can be configured to provide a piecewise compensation current responsive to the correction current and a respective trim code of trim codes.

20 Claims, 10 Drawing Sheets

US 11,929,755 B2

PIECEWISE COMPENSATION FOR VOLTAGE REFERENCE TEMPERATURE DRIFT

CROSS-REFERENCE TO RELATED APPLICATION

This application claims priority to Indian Provisional Patent Application Serial No. 202141039096, filed 29 Aug. 2021, which is incorporated herein in its entirety.

TECHNICAL FIELD

This description relates to piecewise compensation to provide ultra-low voltage reference correction.

BACKGROUND

Bandgap reference circuits are used to provide a reference voltage in a variety of mixed signal integrated circuit (IC) applications, such as analog to digital converters (ADCs or A/Ds), digital to analog converters (DACs or D/As), etc. In such applications, it is desired to provide a reference voltage that does not vary with changing temperature, including at low temperatures. However, the output voltage of most bandgap reference circuits tends to drift as a function of temperature, including due to first and higher-order temperature effects.

SUMMARY

In a described example, a circuit includes a knee code selector that can be configured to set a knee point temperature for a correction current responsive to a respective knee point temperature code of knee point temperature codes and a respective temperature sense signal of temperature sense signals. The circuit includes an output circuit that can be configured to provide the correction current responsive to the respective temperature sense signal and temperature voltages, and a trim DAC that can be configured to provide a piecewise compensation current responsive to the correction current and a respective trim code of trim codes.

In another described example, a system includes a piecewise compensation circuit that can include a knee code selector that can be configured to set a knee point temperature for a correction current responsive to a respective knee point temperature code of knee point temperature codes and a respective temperature sense signal of temperature sense signals. The piecewise compensation circuit can include an output circuit that can be configured to provide the correction current responsive to the respective temperature sense signal and temperature voltages, and trim DAC that can be configured to provide a piecewise compensation current responsive to the correction current and a respective trim code of trim codes. The system can include a bandgap reference circuit that can be configured to provide a bandgap reference voltage at an output terminal responsive to the piecewise compensation current.

In a further described example, a circuit can include a knee code selector circuit that can have a first bias current input, a second bias current input, knee code inputs, and first and second knee point current outputs. The first bias current input can be adapted to be coupled to a first current source, and the second bias current input can be adapted to be coupled to a second current source. The knee code inputs can be coupled to a respective output of a respective knee code storage circuit or register. The circuit can further include an output circuit that can have a first current bias input, a second current bias input, and a current output. The first current bias input of the output circuit can be coupled to the first knee point current output, the second current bias input of the output circuit can be coupled to the second knee point current output. The circuit can include a trim DAC that can have a trim input. The trim input can be coupled to the current output of the output circuit.

DETAILED DESCRIPTION

Figure 1:
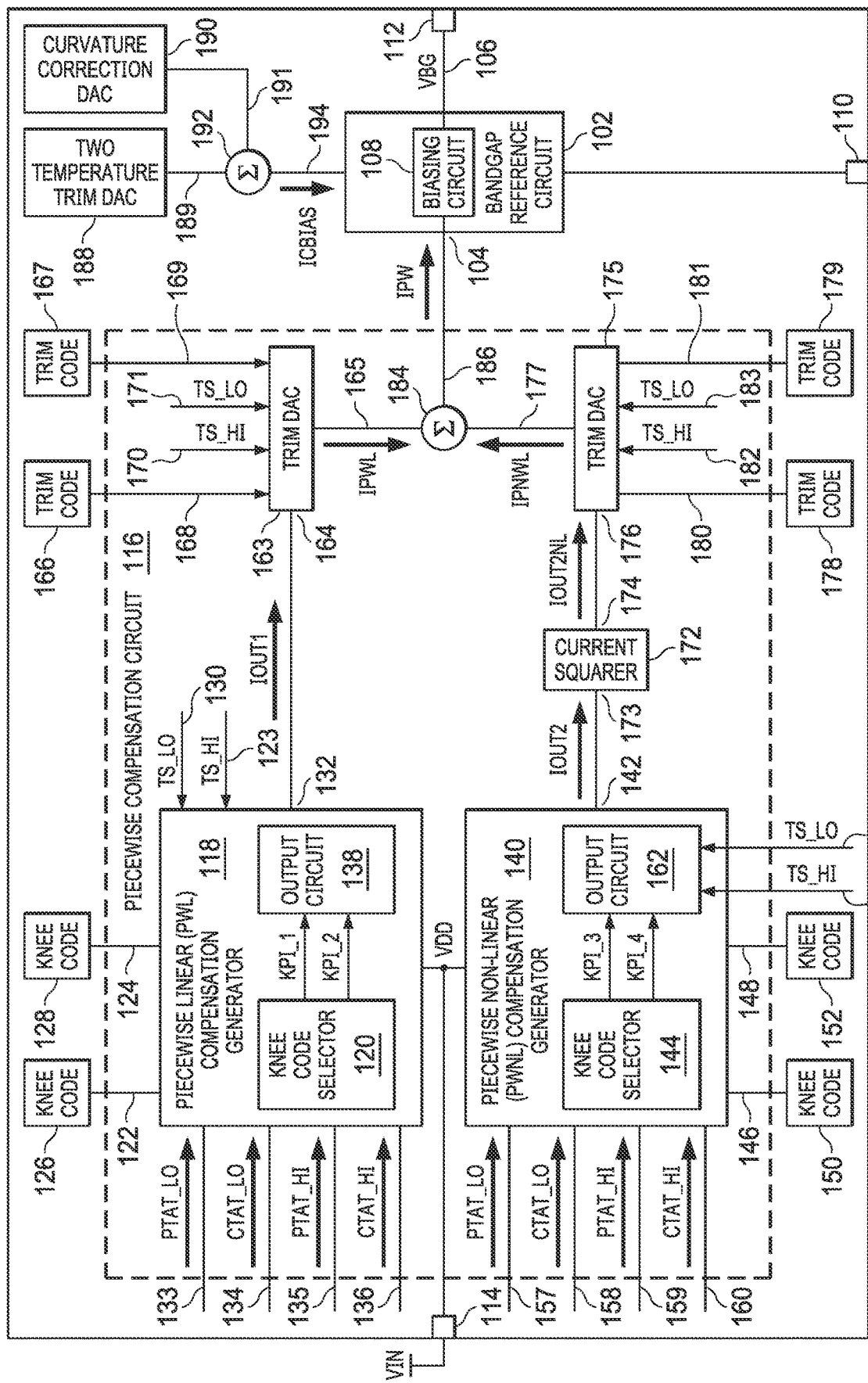
FIG. 1 is a block diagram of a voltage reference device.

This description relates generally to piecewise compensation. A voltage reference device can include a bandgap reference circuit that can be configured to provide a bandgap reference voltage responsive to a piecewise compensation current. The piecewise compensation current can be provided by a piecewise compensation circuit of the voltage reference device. The piecewise compensation current can be employed by the bandgap reference circuit for linear and non-linear piecewise compensation over different operating temperature ranges of the voltage reference device. The piecewise compensation circuit can be configured to provide the piecewise compensation current to compensate for temperature effects on the bandgap reference voltage to control an amplitude of the bandgap reference voltage with respect to the different operating temperature ranges of the voltage reference device.

To provide for linear piecewise compensation, the piecewise compensation circuit can include a piecewise linear (PWL) compensation generator circuit. The PWL compensation generator circuit includes a first knee code selector. The first knee code selector can be configured to set a knee point temperature of a linear correction current to one of a first knee point temperature or a second knee point temperature responsive to knee point temperature codes and to respective proportional to absolute temperature (PTAT) and complementary to absolute temperature (CTAT) voltages. The PTAT voltages can be voltage signals that vary proportionally with respect to an absolute temperature, having a positive temperature coefficient. The CTAT voltages can be voltage signals that can vary in a complementary fashion with respect to the absolute temperature, having a negative temperature coefficient. The PWL compensation generator circuit can be configured to provide the linear correction current at or about one of the first and second knee point temperatures for piecewise linear compensation of the bandgap reference voltage over the different temperature ranges.

To provide for non-linear piecewise compensation, the piecewise compensation circuit can include a piecewise non-linear (PWNL) compensation generator circuit. The PWNL compensation generator circuit can include a second knee code selector that can be configured to set a knee point temperature of a non-linear correction current to one of the first knee point temperature or the second knee point temperature responsive to the knee point temperature codes and the PTAT and CTAT voltages. The PWNL compensation generator can be configured to provide the non-linear correction current at or about one of the first and second knee point temperatures for piecewise non-linear compensation of the bandgap reference voltage over the different temperature ranges.

The piecewise compensation circuit can include first and second trim DACs. The first trim DAC can be configured to regulate (e.g., trim) the linear correction current to provide a piecewise linear compensation current responsive to first trim codes. The second trim DAC can be configured to receive a squared non-linear correction current of the non-linear correction current. The second trim DAC can be configured to regulate (e.g., trim) the squared non-linear correction current to provide a piecewise non-linear compensation current responsive to second trim codes. In some examples, the piecewise compensation current provided to the bandgap reference circuit is the piecewise linear compensation current. In other examples, the piecewise non-linear compensation current is the piecewise compensation current. In further examples, a summer is used to sum the piecewise compensation current and the piecewise non-linear compensation current to provide the piecewise compensation current to the bandgap reference circuit. The bandgap reference circuit can establish an internal bias voltage responsive to the piecewise compensation current and regulate the amplitude of the bandgap reference voltage responsive to the established internal bias voltage.

FIG. 1 is a schematic diagram of a voltage reference device 100, such as an integrated circuit (IC) or other packaged electronic device. The voltage reference device 100 includes a bandgap reference circuit 102. The bandgap reference circuit 102 includes a bias input 104 and an output 106. The input 104 can receive a piecewise compensation current IPW. The bandgap reference circuit 102 can establish an internal bias voltage responsive to the piecewise compensation current IPW, and output a bandgap reference voltage VBG at the output 106 responsive to the internal bias voltage. For example, the bandgap reference circuit 102 includes a biasing circuit 108 that is configured to receive the piecewise compensation current IPW. The biasing circuit 108 can be coupled between the bias input 104 and a reference terminal 110 of the voltage reference device 100. The reference terminal 110 can be coupled to a ground. As an example, the biasing circuit 108 is a biasing resistor and a voltage across the biasing resistor establishes the internal bias voltage.

The output 106 of the bandgap reference circuit 102 can be coupled to an output terminal 112 of the voltage reference device 100 to provide the bandgap reference voltage VBG (e.g., to another device, such as an ADC). The bandgap reference circuit 102 can be of any suitable topology having the output 106 that provides the bandgap reference voltage VBG, and the input 104 that sources and/or sinks the piecewise compensation current IPW. Different circuit implementations are possible in other implementations. The voltage reference device 100 includes a power supply input or supply terminal 114 that receives an input voltage VIN and provides a supply voltage VDD.

The voltage reference device 100 includes a piecewise compensation circuit 116. The piecewise compensation circuit 116 can be configured to provide the piecewise compensation current IPW to compensate for temperature effects on the bandgap reference voltage VBG to control an amplitude of the bandgap reference voltage VBG with respect to temperature in a range from a first temperature T1 to a second temperature T2, as illustrated and described in greater detail below with respect to FIGS. 10-15. In one example, the piecewise compensation circuit 116 is configured to compensate for three (3) temperature ranges, including a first range from a temperature T1 to T2, which represents a desired thermal operating range for the voltage reference device 100 in a host circuit or system. A second range extends below the first temperature T1 to a third temperature T3 (e.g., T3<T1), and a third range extends above the second temperature T2 to a fourth temperature T4 (e.g., T4>T2). Boundaries between these ranges or pieces of a piecewise compensation temperature domain can be referred to as knees or bend point temperatures, although these need not exhibit an actual inflection or bend of a performance parameter (e.g., voltage, current, etc.) with respect to temperature.

The example device 100 of FIG. 1 is described as involving three temperature ranges or pieces, and two bend points or knee point temperatures. In other examples, different implementations of the device 100 are possible that provide piecewise compensation for any integer number k temperature ranges or pieces, having k−1 associated bend points or knee temperatures, where k is an integer greater than 1. The example device 100 of FIG. 1 provides both piecewise linear and piecewise nonlinear compensation. In other examples, individual pieces or temperature ranges can be compensated linearly and/or non-linearly or combinations thereof.

In one example, the piecewise compensation circuit 116 is integrated with the bandgap reference circuit 102 and the further circuitry of FIG. 1 in a single IC chip, with interconnections there between made through direct silicon connections and/or metallization layer routings (not shown). The piecewise compensation circuit 116 includes a PWL compensation generator circuit 118. In one example, the PWL compensation generator circuit 118 is configured to provide a linear correction current IOUT1 at an output 123. The PWL compensation generator circuit 118 can be configured to set a knee point temperature of the linear correction current IOUT1. In some examples, the PWL compensation generator circuit 118 is configured to set the knee point temperature of the linear correction current IOUT1 to the first temperature referred to herein as a first knee point temperature. In other examples, the PWL compensation generator circuit 118 is configured to set the knee point temperature of the linear correction current IOUT1 to the second temperature referred to herein as a second knee point temperature. The PWL compensation generator circuit 118 can be configured to provide the linear correction current IOUT1 at about the first knee point temperature and other examples at about the second knee point temperature.

The PWL compensation generator circuit 118 can include a knee code selector 120. The knee code selector 120 can be configured to set a knee point temperature of the linear correction current IOUT1, such as to one of the first and second knee point temperatures T1 and T2 based on an operating temperature of the voltage reference device 100. For example, the PWL compensation generator circuit 118 has a first knee input 122 and a second knee input 124. The first and second knee inputs 122 and 124 can be configured to receive respective knee point temperature codes 126 and 128. In one example, the knee point temperature codes 126 and 128 are stored in respective memory registers. In another example, the knee point temperature codes 126 and 128 are stored in respective one-time programmable (OTP) circuits (e.g., fuses, etc.) that are programmed during manufacturing of the voltage reference device 100. In one example, the knee point temperature code 126 sets the knee point temperature T1 of the linear correction current IOUT1. In another example, the knee point temperature code 128 sets the knee point temperature T2 of the linear correction current IOUT1.

The knee code selector 120 can be configured to select one of the knee point temperature codes 126 and 128 for the linear correction current IOUT1 based on the operating temperature of the voltage reference device 100. For example, the knee code selector 120 is configured to select one of the knee point temperature codes 126 and 128 responsive to temperature sense high and low signals TS_HI and TS_LO, which can be generated responsive to temperature voltages. The temperature voltages can include a PTAT_LO voltage, a CTAT_LO voltage, a PTAT_HI voltage, and a CTAT_HI voltage. The PWL compensation generation circuit 118 can include inputs 130 and 132. The input 130 can receive the temperature sense high signal TS_HI, and the input 132 can receive the temperature sense low signal TS_LO.

In some examples, the knee code selector 120 is configured to receive the temperature sense low signal TS_LO with a high signal value. The temperature sense low signal TS_LO with the high signal value can indicate that the temperature of the voltage reference device 100 is at or about the second knee point temperature T1. The knee code selector 120 can be configured to output a knee point temperature current KPI_1 responsive to the knee point temperature code 128 and the temperature sense low signal TS_LO with the high signal value. The knee point temperature current KPI_1 can be provided to an output circuit 138. The output circuit 138 can be configured to output the linear correction current IOUT1 at the output 123 responsive to the knee point temperature current KPI_1, the temperature sense low signal TS_LO with the high signal value, the CTAT_HI voltage with a high signal value, and the PTAT_HI voltage with a high signal value. The PWL compensation generator circuit 118 can include inputs 133, 134, 135, and 136. The input 133 can receive the PTAT_LO voltage, the input 134 can receive the CTAT_LO voltage, the input 135 can receive the PTAT_HI voltage, and the input 136 can receive the CTAT_HI voltage.

In some examples, the knee code selector 120 is configured to receive the temperature sense high signal TS_HI with a high signal value. The temperature sense high signal TS_HI with the high signal value can indicate that the temperature of the voltage reference device 100 is at or about the first knee point temperature T2. The knee code selector 120 can be configured to output a knee point temperature current KPI_2 responsive to the knee point temperature code 126 and the temperature sense high signal TS_HI with the high signal value. The knee point temperature current KPI_2 can be provided to the output circuit 138. The output circuit 138 can be configured to output the linear correction current IOUT1 at the output 123 responsive to the knee point temperature current KPI_2, the temperature sense high signal TS_HI, the CTAT_LO voltage with a high signal value, and the PTAT_LO voltage with a high signal value.

Accordingly, the PWL compensation generator circuit 118 can be configured to provide the linear correction current IOUT1 at or about one of the first and second knee point temperatures T1 and T2 for piecewise linear compensation of the bandgap reference voltage VBG.

In some examples, the piecewise compensation circuit 116 includes a PWNL compensation generator circuit 140. In one example, the PWNL compensation generator circuit 140 is configured to provide a non-linear correction current IOUT2 at an output 142. The PWNL compensation generator circuit 140 can be configured to set a knee point temperature of the non-linear correction current IOUT2. The PWNL compensation generator circuit 140 is configured to set a knee point temperature of the non-linear correction current IOUT2 to one of the first second knee point temperatures T1 and T2 responsive to the operating temperature of the voltage reference device 100 for piecewise non-linear compensation of the bandgap reference voltage VBG.

The PWNL compensation generator circuit 140 can include a knee code selector 144. The knee code selector 144 can be configured to set the knee point temperature for the non-linear correction current IOUT2 based on the operating temperature of the voltage reference device 100. For example, the PWNL compensation generator circuit 140 has a first knee input 146 and a second knee input 148. The first and second knee inputs 146 and 148 can be configured to receive respective knee point temperature codes 150 and 152. In one example, the knee point temperature codes 150 and 152 are stored in respective memory registers. In another example, the knee point temperature codes 150 and 152 are stored in respective OTP circuits (e.g., fuses, etc.) that can be programmed during manufacturing of the voltage reference device 100. In one example, the knee point temperature code 150 sets the knee point temperature T1 of the non-linear correction current IOUT2. In another example, the knee point temperature code 152 sets the knee point temperature T2 of the non-linear correction current IOUT2.

The knee code selector 144 can be configured to select one of the knee point temperature codes 150 and 152 for the non-linear correction current IOUT2 based on the operating temperature of the voltage reference device 100. For example, the knee code selector 144 is configured to select one of the knee point temperature codes 150 and 152 responsive to the temperature sense high and low signals TS_HI and TS_LO. The PWNL compensation generation circuit 140 can include inputs 154 and 156. The input 154 can receive the temperature sense high signal TS_HI, and the input 156 can receive the temperature sense low signal TS_LO.

In some examples, the knee code selector 144 is configured to receive the temperature sense low signal TS_LO with the high signal value. The knee code selector 144 can be configured to output a knee point temperature current KPI_3 responsive to the knee point temperature code 152 and the temperature sense low signal TS_LO with the high signal value. The knee point temperature current KPI_3 can be provided to an output circuit 162. The output circuit 162 can be configured to output the non-linear correction current IOUT2 at the output 142 responsive to the knee point temperature current KPI_3, the temperature sense low signal TS_LO with the high signal value, the CTAT_HI voltage with the high signal value, and the PTAT_HI voltage with the high signal value. The PWNL compensation generator circuit 140 can include inputs 157, 158, 159, and 160. The input 157 can receive the PTAT_LO voltage, the input 158 can receive the CTAT_LO voltage, the input 159 can receive the PTAT_HI voltage, and the input 160 can receive the CTAT_HI voltage.

In some examples, the knee code selector 144 is configured to receive the temperature sense high signal TS_HI with the high signal value. The knee code selector 144 can be configured to output a knee point temperature current KPI_4 responsive to the knee point temperature code 150 and the temperature sense high signal TS_HI with the high signal value. The knee point temperature current KPI_2 can be provided to the output circuit 138. The output circuit 162 can be configured to output the linear correction current IOUT1 at the output 142 responsive to the knee point temperature current KPI_2, the temperature sense high signal TS_HI with the high signal value, the CTAT_LO voltage with the high signal value, and the PTAT_LO voltage with the high signal value.

Accordingly, the PWNL compensation generator circuit 140 can be configured to provide the non-linear correction current IOUT2 at or about one of the first and second knee point temperatures T1 and T2 for piecewise non-linear compensation of the bandgap reference voltage VBG.

In some examples, the piecewise compensation circuit 116 includes a trim DAC 163 having an input 164 and an output 165, in which the input 163 is coupled to the output 123. The input 164 is configured to receive the linear correction current IOUT1 from the PWL compensation generator circuit 118. The trim DAC 163 can be configured to regulate (e.g., trim) the linear correction current IOUT1 to provide a piecewise linear compensation current IPWL at the output 165. The trim DAC 164 can be configured to set (e.g., adjust) an amplitude of the linear correction current IOUT1 responsive to trim codes 166 and 167 received at respective inputs 168 and 169, and temperature sense high and low signals TS_HI and TS_LO signals received at respective inputs 170 and 171. In one example, the trim codes 166 and 167 are stored in respective memory registers. In another example, the trim codes 166 and 167 are stored in respective OTP circuits (e.g., fuses, etc.) that are programmed during manufacturing of the voltage reference device 100. The trim DAC 163 is configured to adjust the amplitude of the linear correction current IOUT1 to provide the piecewise linear compensation current IPWL responsive to the trim code 166 and the temperature sense low signal TS_LO with the high signal value, such as when the temperature of the voltage reference device 100 is at or less than the first knee point temperature T1. In other examples, the trim DAC 163 is configured to adjust the amplitude of the linear correction current IOUT1 to provide the piecewise linear compensation current IPWL responsive to the trim code 167 and the temperature sense high signal TS_HI with the high signal value, such as when the temperature of the voltage reference device 100 is at or greater than the second knee point temperature T2.

In some examples, the piecewise compensation circuit 116 includes a current squarer 172 having an input 173 and an output 174. The input 173 can receive the non-linear correction current IOUT2. The current squarer 172 can provide at the output 174 a squared non-linear correction current IOUT2NL responsive to the non-linear correction current IOUT2. The piecewise compensation circuit 116 can further include a trim DAC 175 having an input 176 and an output 177. The output 174 of the current squarer 172 is coupled to the input 176 of the trim DAC 175. The trim DAC 175 is configured to provide a piecewise non-linear compensation current IPNWL at the output 177 responsive to the non-linear correction current IOUT2NL.

The trim DAC 175 can be configured to regulate (e.g., trim) the squared non-linear correction current IOUT2NL to provide the piecewise non-linear compensation current IPNWL at the output 177. The trim DAC 175 can be configured to set (e.g., adjust) an amplitude of the squared non-linear correction current IOUT2NL responsive to trim codes 178 and 179 received at respective inputs 180 and 181, and the temperature sense high and low signals TS_HI and TS_LO signals received at respective inputs 182 and 183. In one example, the trim codes 178 and 179 are stored in respective memory registers. In another example, the trim codes 178 and 179 are stored in respective OTP circuits (e.g., fuses, etc.) that are programmed during manufacturing of the voltage reference device 100.

The trim DAC 175 is configured to adjust the amplitude of the squared non-linear correction current IOUT2NL to provide the piecewise non-linear compensation current IPNWL responsive to the trim code 178 and the temperature sense low signal TS_LO with the high signal value, such as when the temperature of the voltage reference device 100 is at or less than the first knee point temperature T1. In other examples, the trim DAC 180 is configured to adjust the amplitude of the squared non-linear correction current IOUT2NL to provide the piecewise non-linear compensation current IPNWL responsive to the trim code 179 and the temperature sense high signal TS_HI with the high signal value, such as when the temperature of the voltage reference device 100 is at or greater than the second knee point temperature T2.

The piecewise compensation circuit 116 further includes a summer 184 having inputs and an output 186. The summer inputs are coupled to respective outputs 165 and 177. The summer 184 can be configured to sum the piecewise linear compensation current IPWL and the piecewise non-linear compensation current IPNWL to provide the piecewise compensation current IPW at the output 186. In one example, the summer 184 is a summing junction or node coupled to the outputs 165 and 177 of the respective trim DACs 163 and 175.

In some examples, the voltage reference device 100 includes lower-order temperature compensation circuitry, shown as including a two temperature trim DAC 188 having an output 189, and a curvature correction DAC 190 having an output 191. In some examples, the two temperature trim DAC 188 is configured to provide the PTAT_LO, CTAT_LO, PTAT_HI, and CTAT_HI voltages. The outputs 189 and 191 are coupled to respective inputs of a summer 192 (e.g., a summing junction or node). The summer 192 has an output 194 coupled to an input of the bandgap reference circuit 102. The summer 192 is configured to provide a bias compensation current ICBIAS at the output 194. The bandgap reference circuit 102 can be configured to establish the internal bias voltage responsive to the piecewise compensation current IPW and the bias compensation current ICBIAS to provide the bandgap reference voltage VBG at the output 106.

In the example of FIG. 1, the bandgap reference circuit 102 is configured to implement temperature compensation for 0th, 1st, 2nd, and higher-order thermal effects in the voltage reference device 100 to mitigate temperature drift of the bandgap reference voltage VBG and provide a high precision voltage reference with ultra-low temperature drift. In particular, the two temperature trim DAC 188 is configured to compensate for 0th and 1st order thermal effects, the curvature correction DAC 190 compensates for 2nd order effects, and the piecewise compensation circuit 116 is configured to compensate for higher-order thermal effects on the bandgap reference voltage VBG. The voltage reference device 100 mitigates output voltage temperature drift with compensation circuitry that senses the temperature and adds a corrective signal or signals to the internal bias voltage to regulate the bandgap reference voltage VBG at the output terminal 112. In one example, the voltage at the first knee point temperature T1 (e.g., 25 degrees Celsius) can be corrected by the two temperature trim DAC 188. In this example, the 2nd order effects are compensated by the curvature correction DAC 190.

Process variations and/or component value mismatch issues can increase the temperature drift (e.g., above about 5-10 ppm/C) absent further compensation. For example, the piecewise compensation circuit 116 enables further temperature drift reduction to achieve temperature drift of less than 0.5-1.0 ppm/C, such as by compensating higher-order thermal effects. Moreover, the voltage reference device 100 provides a variable knee piecewise linear and nonlinear compensation solution to facilitate low thermal drift in the bandgap reference voltage VBG. Unlike piecewise compensation using fixed inflection or knee point temperatures, the example device 100 is configured to implement the piecewise compensation IPW to provide variable inflection or knee temperature, which is independent of process variations and can be set during electronic device fabrication.

Figure 2:
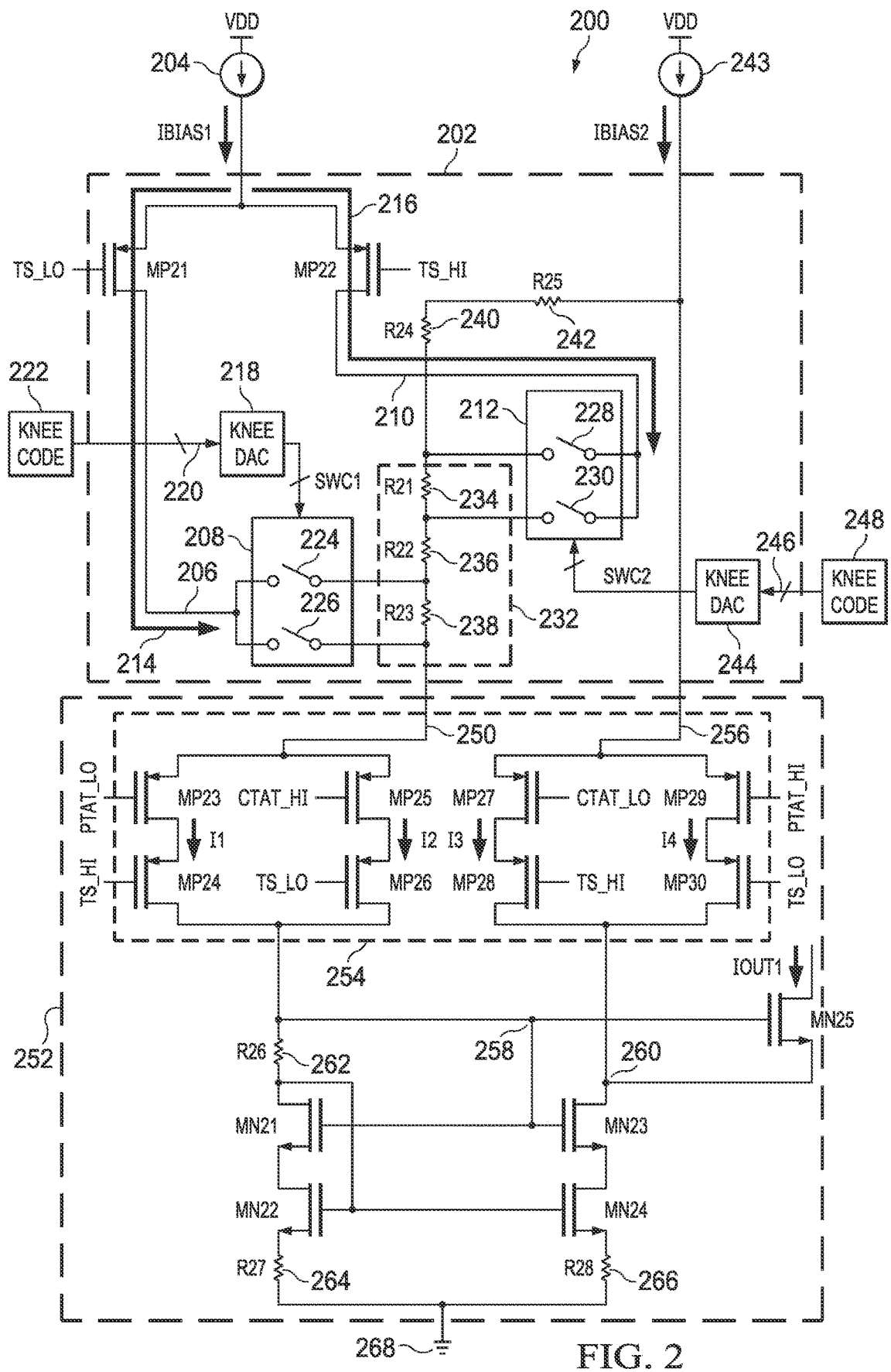
FIG. 2 is a schematic diagram of a piecewise compensation generator circuit.

FIG. 2 is a schematic diagram of a piecewise compensation generator circuit 200. The piecewise compensation generator circuit 200 is an example of the PWL compensation generator circuit 118 shown in FIG. 1. While the example of FIG. 2 is described with respect to a PWL compensation generator circuit, a PWNL compensation generator circuit, such as the PWNL compensation generator circuit 140, as shown in FIG. 1, can be implemented in a same or similar manner. Therefore, the following description of FIG. 2 also refers to FIG. 1. The piecewise compensation generator circuit 200 can be configured to set a knee point temperature of the linear correction current IOUT1.

The piecewise compensation generator circuit 200 can include a knee code selector 202. The knee code selector 202 is an example of the knee code selector 120, as shown in FIG. 1. The knee code selector 202 can be configured to set the knee point temperature of the linear correction current IOUT1 based on an operating temperature of the voltage reference device 100. For example, the knee code selector 202 is configured to cause the linear correction current IOUT1 to be provided at or about the first knee point temperature T1. In some examples, the knee code selector 202 is configured to cause the linear correction current IOUT1 to be provided at or about the second knee point temperature T2. Accordingly, at or about the first and second knee point temperatures T1 and T2, the piecewise compensation generator circuit 200 can be configured to deliver or provide the correction current IOUT1.

The knee code selector 202 can include transistors MP21 and MP22. As an example, the transistors MP21 and MP22 are p-channel field effect transistors (PFETs) or p-channel metal-oxide-semiconductor (PMOS) transistors. A bias current source 204 is coupled to the transistors MP21 and MP22. A source of each of the transistors MP21 and MP22 can be coupled to the bias current source 204. The bias current source 204 can be configured to provide a current bias IBIAS1 responsive to the supply voltage VDD. A drain of the transistor MP21 can be coupled to a node 206. A high-temperature sensing network 208 can be coupled to the node 206. A drain of the transistor MP22 can be coupled to a node 210. For example, the high-temperature sensing network 208 can include a number of switches. For clarity purposes, the high-temperature sensing network 208 in the example of FIG. 2 includes two switches 224 and 226. However, the high-temperature sensing network 208 can include any number of switches. An input of each switch can be coupled to the node 206. Thus, the input of the switches 224 and 226 can be coupled to the node 204 to receive the current bias IBIAS1.

In the example of FIG. 1, a low-temperature sensing network 212 is also coupled to the node 210. The low-temperature sensing network 212 can include a number of switches. For clarity purposes, the low-temperature sensing network 212 in the example of FIG. 2 includes two switches 228 and 230. However, the low-temperature sensing network 212 can include any number of switches. An input of each switch can be coupled to the node 210. Thus, the input of the switches 228 and 230 can be coupled to the node 210 to receive the current bias IBIAS1.

As an example, a gate of the transistor MP21 can receive a temperature sense low signal TS_LO with a low signal value, such as when the temperature of the voltage reference device 100 is at our about the second knee point temperature T2. The transistor MP21 can provide the current bias IBIAS1 along a high-temperature current path 214 responsive to the temperature sense low signal TS_LO with the low signal value. In some examples, a gate of the transistor MP22 can receive a temperature sense high signal TS_HI with a low signal value, such as when the temperature of the voltage reference device 100 is at our about the first knee point temperature T1. The transistor MP22 can provide the current bias IBIAS1 along a low-temperature current path 216 responsive to the temperature sense high signal TS_HI with the low signal value.

In some examples, the piecewise compensation generator circuit 200 includes a knee DAC 218. An input 220 of the knee DAC 218 can receive a knee point temperature code 222. In some examples, the knee point temperature code 222 is the knee point temperature code 128, as shown in FIG. 1. In some examples, the knee point temperature code 222 is a multi-bit knee point temperature code and can set the knee point temperature of the linear correction current IOUT1, such as when the temperature of the voltage reference device 100 is at or about the second knee point temperature T2. For example, the knee point temperature code 222 includes N bits, wherein each bit can be used to control a respective switch of the high-temperature sensing network 208. As such, the knee DAC 218 can receive N bits KC1<01>, KC1<2>, . . . , KC1<N−1> of the knee point temperature code 222.

The piecewise compensation generator circuit 200 can include a resistor chain 232. The resistor chain 232 includes a number of resistors that can be coupled between respective outputs of the switches of each of the high and low-temperature sensing networks 208 and 212. For clarity purposes in the example of FIG. 2, the resistor chain 232 includes three (3) resistors 234, 236, and 238. The resistors 234, 236, and 238 have respective resistances R21, R22, and R23. The resistors 234, 236, and 238 are coupled in series in the resistor chain 232. Respective outputs of the switches 224 and 226 of the low-temperature sensing network 212 are coupled to the resistor chain 232, and respective outputs of the switches 228 and 230 are coupled to the resistor chain 232. A respective resistor of the resistor chain 232 can be coupled between respective outputs of the switches of the high and low-temperature sensing networks 208 and 212. For example, the resistor 234 is coupled between the respective outputs of the switches 228 and 230. The resistor 236 can be coupled between the respective outputs of the switches 230 and 224, and the resistor 238 can be coupled between the respective outputs of the switches 224 and 226. By way of further example, the resistor chain 232 is coupled in series with resistors 240 and 242 to connect the resistor chain 232 to the bias current source 204. The resistors 240 and 242 have respective resistances R24 and R25, as shown in FIG. 2. The resistor chain 242 can be coupled to a bias current source 243. The bias current source 243 can be configured to provide a current bias IBIAS2 responsive to the supply voltage VDD.

In some examples, the piecewise compensation generator circuit 200 includes a knee DAC 244. An input 246 of the knee DAC 244 can receive a knee point temperature code 248. The knee point temperature code 248 is an example of the knee point temperature code 126, as shown in FIG. 1. In some examples, the knee point temperature code 248 is a multi-bit knee point temperature code and sets the knee point temperature of the linear correction signal IOUT1, such as when the temperature of the voltage reference device 100 is at or about the first knee point temperature T1. For example, the knee point temperature code 248 includes N bits, wherein each bit can be used to control a respective switch of the low-temperature sensing network 212. As such, the knee DAC 244 can receive N bits KC2<01>, KC2<2>, . . . , KC2<N−1> of the knee point temperature code 248.

In some examples, the knee DAC 218 is configured to receive the knee point temperature code 222 and generate switch control signals SWC1. The switch control signals SWC1 can be provided to the high-temperature sensing network 208. A number of switches of the high-temperature sensing network 208 that can be activated (e.g., closed) can set the knee point temperature of the linear correction current IOUT1. For example, if the switches 224 and 226 are activated, the high-temperature sensing network 208 can set the knee point temperature of the linear correction current IOUT1 to the knee point temperature T2. Responsive to the switch control signals SWC1, respective switches of the high-temperature sensing network 208 can be activated (e.g., closed) to provide a respective current path for the current bias IBIAS1 through a respective switch of the switches of the high-temperature sensing network 208 to the resistor chain 232. Responsive to the switch control signals SWC1, respective switches of the high-temperature sensing network 208 are activated (e.g., closed) to provide an adjusted bias current to an input 250 of an output circuit 252. The adjusted bias current supplies current I1 to the output circuit 252, such as when the temperature of the voltage reference device 100 is at or about the second knee point temperature T2. In some examples, the adjusted bias current that flows to the input of the output circuit is the knee point temperature current KPI_2, as shown in FIG. 1, such as when the temperature of the voltage reference device 100 is at or about the second knee point temperature T2.

In some examples, the knee DAC 244 is configured to receive the knee point temperature code 248 and generate switch control signals SWC2. The switch control signals SWC2 can be provided to the low-temperature sensing network 212. A number of switches of the low-temperature sensing network 212 that can be activated (e.g., closed) can set the knee point temperature of the linear correction current IOUT. For example, if the switches 228 and 230 are activated, the low-temperature sensing network 212 can set the knee point temperature of the linear correction current IOUT to the knee point temperature T1. Responsive to the switch control signals SWC2, respective switches of the low-temperature sensing network 212 are activated (e.g., closed) to provide the adjusted bias current to the input 250 of the output circuit 252. The adjusted bias current supplies current I2 to the output circuit 252, such as when the temperature of the voltage reference device 100 is at or about the first knee point temperature T1. In some examples, the adjusted bias current that flows to the input of the output circuit is the knee point temperature current KPI_1, as shown in FIG. 1, such as when the temperature of the voltage reference device 100 is at or about the second knee point temperature T2.

The piecewise compensation generator circuit 200 can include the output circuit 252, as shown in FIG. 2. In some examples, the output circuit 252 is the output circuit 138, as shown in FIG. 1. The output circuit 252 includes a temperature signal multiplexer circuit 254 that includes transistors MP23, MP24, MP25, MP26, MP27, MP28, MP29, and MP30. As an example, the transistors MP23, MP24, MP25, MP26, MP27, MP28, MP29, and MP30 are PFETs or PMOS transistors. The transistors MP23 and MP25 can have respective sources coupled to the node 250. Respective sources of the transistors MP27 and MP29 can have respective sources coupled to a node 256. The node 256 can be configured to receive the current bias IBIAS2. Respective drains of the transistors MP23 and MP25 can be coupled to respective drains of the transistors MP24 and MP26. Respective drains of the transistors MP27 and MP29 can be coupled to respective drains of the transistors MP28 and MP30. Respective drains of the transistors MP24 and MP26 can be coupled to a node 258 and respective drains of the transistors MP28, and MP30 can be coupled to a node 260.

In the example of FIG. 2, a gate of the transistor MP23 can be configured to receive the PTAT_LO voltage. A gate of the transistor MP24 can be configured to receive the temperature sense high signal TS_HI. A gate of the transistor MP25 can be configured to receive the CTAT_LO voltage. A gate of the transistor MP26 can be configured to receive the temperature sense low signal TS_LO. A gate of the transistor MP27 can be configured to receive the CTAT_LO voltage. A gate of the transistor MP28 can be configured to receive the temperature sense high signal TS_HI. A gate of the transistor MP29 can be configured to receive the PTAT_HI voltage. A gate of the transistor MP30 can be configured to receive the temperature sense low signal TS_LO.

In some examples, the gate of the transistor MP23 is configured to receive the PTAT_LO voltage with the low signal value, and the gate of the transistor MP24 is configured to receive the temperature switch high signal TS_HI with the low signal value, such as when the temperature of the voltage reference device 100 is at or about second knee point temperature T1. The current I1 can flow through the transistors MP23 and MP24 to the node 258. In some examples, when the temperature of the voltage reference device 100 is at or about second knee point temperature T1, the gate of the transistor MP27 is configured to receive the CTAT_LO voltage with the low signal value, and the gate of the transistor MP28 can be configured to receive the temperature switch high signal TS_HI with the low signal value. A current bias 13 flows through the transistors MP27 and MP28 to the node 260.

In some examples, the gate of the transistor MP25 is configured to receive the CTAT_HI voltage with the low signal value, and the gate of the transistor MP26 is configured to receive the temperature switch low signal TS_LO with the signal low value, such as when the temperature of the voltage reference device 100 is at or about first knee point temperature T2. The current I2 flows through the transistors MP25 and MP26 to the node 258. In some examples, when the temperature of the voltage reference device 100 is at or about first knee point temperature T2, the gate of the transistor MP29 is configured to receive the PTAT_HI voltage with the low signal value, and the gate of the transistor MP30 can be configured to receive the temperature switch low signal TS_LO with the low signal value. A current bias 14 flows through the transistors MP29 and MP30 to the node 260.

The output circuit 252 can further include transistors MN21, MN22, MN23, MN24, and MN25. In some examples, the transistors MN21, MN22, MN23, MN24, and MN25 are NFETs or NMOS transistors. The output circuit 252 can include a resistor 262 with a resistance R26 that can be coupled between the node 256 and to a drain of the transistor MN21. Respective gates of the transistors MN21 and MN23 can be coupled to the node 258 and a respective gate of the transistor MN25 can be coupled to the node 260. Thus, the gates of the transistors MN21, MN23, and MN25 can be configured to receive the current I1 (e.g., when the temperature of the voltage reference device 100 is at or about the second knee point temperature T1) or the current I2 (e.g., when the temperature of the voltage reference device 100 is at or about the first knee point temperature T2).

As a further example, respective sources of the transistors MN21 and MN23 are coupled to a respective drain of the transistors MN22 and MN24. A drain of the transistor MN23 can be coupled to a source of the transistor MN25. A respective gate of the transistors MN22 and MN24 can be coupled to the drain of the transistor MN21. The output circuit 252 can further include resistors 264 and 266 with respective resistances R27 and R28. The resistor 264 can be coupled between the source of the transistor MN22 and a ground 268. The resistor 266 can be coupled between the source of the transistor MN24 and the ground 268.

Because the gates of the transistor MN25 can be configured to receive the first arm current I1 (e.g., when the temperature of the voltage reference device 100 is at or about the second knee point temperature T1) or the current I2 (e.g., when the temperature of the voltage reference device 100 is at or about the first knee point temperature T2), the linear output current IOUT1 can flow between the source and the drain of the transistor MN25. In the example of FIG. 2, the linear output current IOUT1 is shown flowing from the source to the drain of the transistor MN25, such as when a current is being sinked to the bandgap reference circuit 102, as shown in FIG. 1. In other examples, the linear output current IOUT1 can flow from the drain to the source of the transistor MN25, such as when a current is being sourced to the bandgap reference circuit 102.

Accordingly, the piecewise compensation generator circuit 200 can be configured to provide the linear output current IOUT1 at one of the first and second knee point temperatures T1 and T2 for piecewise linear compensation of the bandgap reference voltage VBG. For example, the piecewise compensation generator circuit 200 is configured to provide the linear output current IOUT1 over the second range that extends below the first temperature T1 to the third temperature T3 (e.g., T3<T1), or the third range that extends above the second temperature T2 to the fourth temperature T4 (e.g., T4>T2). This is because the piecewise compensation generator circuit 200 employs the high and low-temperature sensing networks 208 and 212 to selectively select one of the knee codes 222 and 248 for generation of the linear output current IOUT1 over respective second and third ranges.

Figure 3:
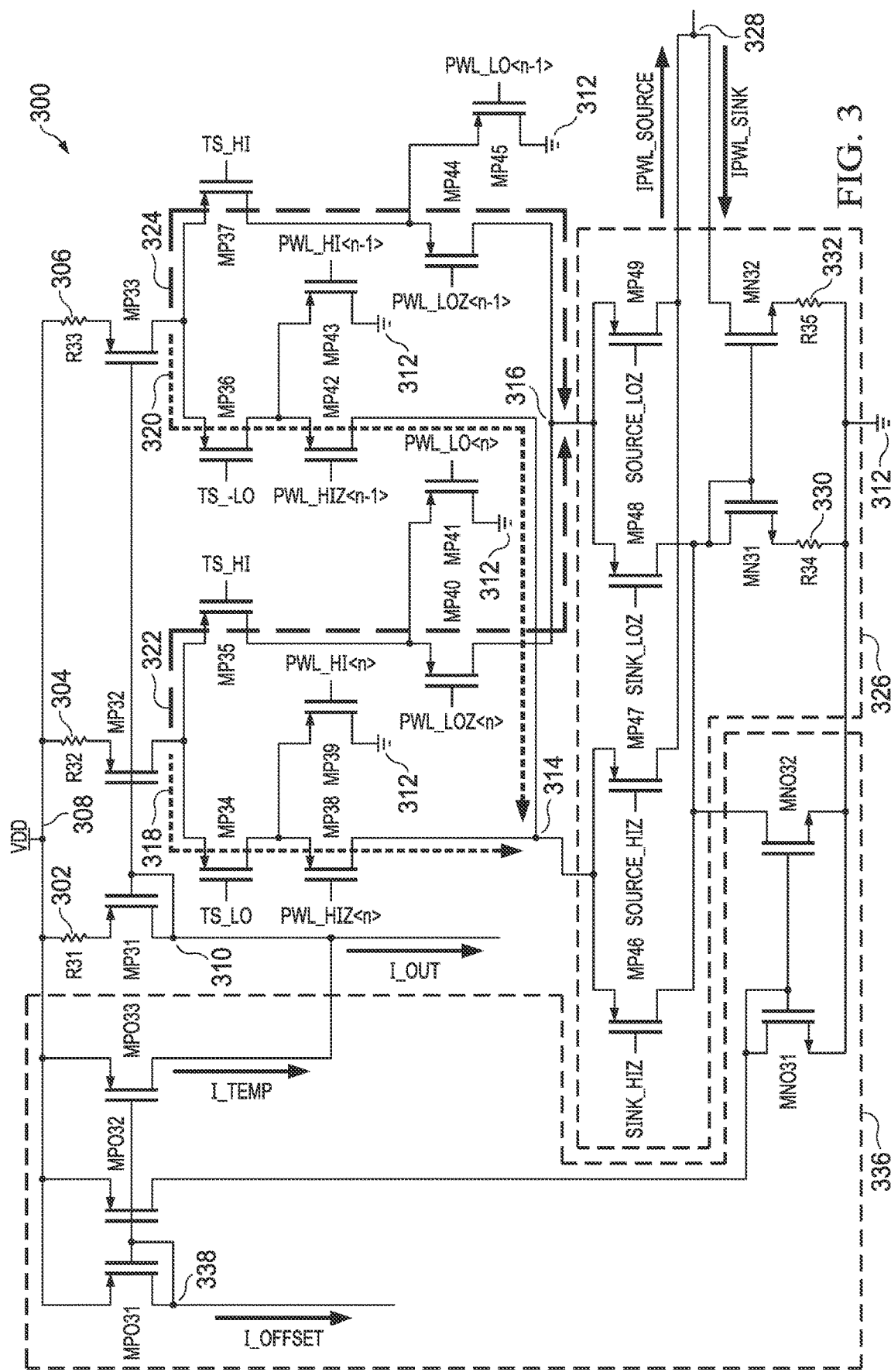
FIG. 3 is a schematic diagram of a trim DAC circuit.

FIG. 3 is a schematic diagram of a trim DAC 300. The trim DAC 300 is an example of the trim DAC 163, as shown in FIG. 1. While the example of FIG. 3 is described with respect to the trim DAC 163, the trim DAC 175, as shown in FIG. 1, can be implemented in a same or similar manner. Therefore, the following description of FIG. 3 also refers to FIGS. 1 and 2. The trim DAC 300 includes transistors MP31, MP32, and MP33. As an example, the transistors MP31, MP32, and MP33 are PFETs or PMOS transistors. Resistors 302, 304, and 306 having respective resistances R31, R32, and R33 can be coupled between respective sources of the transistors MP31, MP32, and MP33 and a supply node 308 that receives the supply voltage VDD. A voltage can be established across the resistors 302, 304, and 306, and a current can flow to the respective sources of the transistors MP31, MP32, and MP33. Respective gates of the transistors MP31, MP32, and MP33 can be coupled to a node 310. A gate of the transistor MP31 can be coupled to the node 310, as shown in FIG. 3.

In some examples, a linear correction signal IOUT1 flows out of the node 310. In some examples, the linear correction signal IOUT is the linear correction signal IOUT1, as shown in FIG. 1 or 2. In the example of FIG. 3, the linear correction signal IOUT1 is shown flowing out of the node 310, such as when a current is being sinked to the bandgap reference circuit 102. In other examples, the linear correction signal IOUT1 can flow into the node 310, such as when a current is being sourced to the bandgap reference circuit 102.

As a further example, the trim DAC 300 includes transistors MP34, MP35, MP36, and MP37. As an example, the transistors MP34, MP35, MP36, and MP37 are PFETs or PMOS transistors. Respective sources of the transistors MP34 and MP35 are coupled to a gate of the MP32 transistor. Respective sources of the transistors MP36 and MP37 are coupled to a gate of the transistor MP33. Respective gates of the transistors MP34 and MP36 can be configured to receive the temperature sense low signal TS_LO. The temperature sense low signal TS_LO, as shown in FIG. 3, is an example of the temperature sense low signal TS_LO, as shown in FIGS. 1 and 2.

For example, the respective gates of transistors MP34 and MP36 are configured to receive the temperature sense low signal TS_LO with a high signal value, such as when the temperature of the voltage reference device 100 is at or less than the first knee point temperature T1. Respective gates of the transistors MP35 and MP37 can be configured to receive a temperature sense high signal TS_HI. The temperature sense high signal TS_HI, as shown in FIG. 3, is an example of the temperature sense high signal TS_HI, as shown in FIG. 2. The respective gates of transistors MP35 and MP37 are configured to receive the temperature sense high signal TS_HI with the high signal value, such as when the temperature of the voltage reference device 100 is at or greater than the second knee point temperature T2.

The trim DAC 300 further includes transistors MP38, MP39, MP40, and MP41. As an example, the transistors MP38, MP39, MP40, and MP41 are PFETs or PMOS transistors. Respective gates of the transistors MP38 and MP39 can be coupled to a source of the transistor MP34, and respective gates of the transistors MP40 and MP41 can be coupled to a source of the transistor MP35. Respective sources of the transistors MP39 and MP41 are coupled to a ground 312. A source of the transistor MP38 can be coupled to a node 314 and a source of the transistor MP40 can be coupled to a node 316, as shown in FIG. 3. The trim DAC 300 further includes transistors MP42, MP43, MP44, and MP44. As an example, the transistors MP42, MP43, MP44, and MP44 are PFETs or PMOS transistors. Respective gates of the transistors MP42 and MP43 can be coupled to a source of the transistor MP35, and respective gates of the transistors MP44 and MP45 can be coupled to a source of the transistor MP36. Respective sources of the transistors MP43 and MP45 are coupled to the ground 312. A source of the transistor MP42 can be coupled to the node 314 and a source of the transistor MP44 can be coupled to the node 316, as shown in FIG. 3.

For example, the trim DAC 300 is configured to receive the trim codes 166 and 167. The trim code 166 can be a multi-bit trim code that can set a magnitude of the linear correction current IOUT1 over the second temperature range to provide the piecewise linear compensation current IPWL. The trim code 167 can be a multi-bit trim code that can set the magnitude of the linear correction current IOUT1 over the third temperature range to provide the piecewise linear compensation current IPWL.

For example, the trim code 166 includes n-bits. Each bit of the n-bits of the trim code 166 can be used to control a respective transistor of the trim DAC 300. As an example, the n-bits of the trim code 166 includes a PWL_HIZ<n> bit, a PWL_HI<n> bit, PWL_HIZ<n−1> bit, and a PWL_HI<n−1> bit. The PWL_HIZ<n> bit can be provided to a gate of the transistor MP38, the PWL_HI<n> bit can be provided to a gate of the transistor MP39, the PWL_HIZ<n−1> bit can be provided to a gate of the transistor MP42, and the PWL_HI<n−1> bit can be provided to a gate of the transistor MP43. For example, when the temperature of the voltage reference device 100 is at or greater than the second knee point temperature T2, the transistor MP34 is activated responsive to the temperature sense low signal TS_LO and the transistor MP38 is activated responsive to the PWL_HIZ<n> bit. A magnitude trim current 318 can flow through the transistors MP34 and MP38 to the node 314. In some examples, when the temperature of the voltage reference device 100 is at or greater than the second knee point temperature T2, the transistor MP36 is activated responsive to the temperature sense low signal TS_LO, and the transistor MP42 is activated responsive to the PWL_HIZ<n−1> bit. A magnitude trim current 320 can flow through the transistors MP36 and MP42 to the node 314.

In some examples, the trim code 167 includes n-bits. Each bit of the n-bits of the trim code 167 can be used to control a respective transistor of the trim DAC 300. For example, the n-bits of the trim code 167 can include a PWL_LOZ<n> bit, a PWL_LO<n> bit, PWL_LOZ<n−1> bit, and a PWL_LO<n−1> bit. The PWL_LOZ<n> bit can be provided to a gate of the transistor MP40, the PWL_LO<n> bit can be provided to a gate of the transistor MP41, the PWL_LOZ<n−1> bit can be provided to a gate of the transistor MP44, and the PWL_LO<n−1> bit can be provided to a gate of the transistor MP45. For example, when the temperature of the voltage reference device 100 is at or less than the first knee point temperature T1, the transistor MP35 is activated responsive to the temperature sense high signal TS_HI and the transistor MP40 is activated responsive to the PWL_LOZ<n> bit. A magnitude trim current 322 can flow through the transistors MP35 and MP40 to the node 314. In some examples, when the temperature of the voltage reference device 100 is at or less than the free knee point temperature T1, the transistor MP37 is activated responsive to temperature sense high signal TS_HI and the transistor MP44 is activated responsive to the PWL_LOZ<n−1> bit. A magnitude trim current 324 can flow through the transistors MP37 and MP44 to the node 312.

For clarity, the example of FIG. 3, shows the generation of magnitude trim currents using first and second bits of the n-bits of each respective trim code 166 and 167. However, the trim DAC 300 can include additional transistors and resistors arranged and coupled in a same or similar manner. For example, the trim DAC 300 can include the resistor 306 and transistors MP33, MP36, MP37, MP42, MP43, MP44, and MP45, as shown in FIG. 3, coupled between the supply node 308 and a respective node 314 and 316. Thus, in some examples, more than two magnitude trim currents can flow into the node 314 and more than two magnitude trim currents can flow in the node 316.

The trim DAC 300 can include a trim DAC output circuit 326. The trim DAC output circuit 326 can be configured to provide the piecewise linear compensation current IPWL at an output node 328 of the trim DAC 300 responsive to one or more magnitude currents received at the nodes 314 and 316. For example, the trim DAC output circuit 326 is configured to sink or source current with respect to the output node 328 of the trim DAC 300. Thus, in some examples, the piecewise linear compensation current IPWL is sourced or sinked to the bandgap reference circuit 102, as shown in FIG. 1.

The trim DAC output circuit 326 includes transistors MP46, MP47, MP48, and MP49. As an example, the transistors MP46, MP47, MP48, and MP49 are PFETs or PMOS transistors. Respective sources of the transistors MP46 and MP47 can be coupled to the node 314, and respective sources of the transistors MP48 and MP49 can be coupled to the node 316. Respective drains of the transistors MP47 and MP49 can be coupled to the output node 328. In some examples, a drain of the transistor MP46 can be coupled to a drain of the transistor MP48. The trim DAC output circuit 326 can include transistors MN31 and MN32. In some examples, the transistors MN31 and MN32 are NFETs or NMOS transistors. A drain and gate of the transistor MN31 can be coupled to the drain of the transistors MP46 and MP48. A gate of the transistor MN32 can be coupled to the drain of the transistors MP46 and MP48. A drain of the transistor MN32 can be coupled to the output node 328, as shown in FIG. 3. The trim DAC output circuit 326 can include resistors 330 and 332 having respective resistances R34 and R35. The resistor 330 can be coupled between a source of the transistor MN31 and the ground 312. The resistor 332 can be coupled between a source of the transistor MN32 and the ground 312.

In some examples, the trim DAC output circuit 326 can be configured to receive a sink high signal SINK_HIZ, such as when the temperature of the voltage reference device 100 is at or greater than the second knee point temperature T2. The sink high signal SINK_HIZ can be provided to a gate of the transistor MP46. The transistor MP46 can be activated responsive to the sink high signal SINK_HIZ to cause a piecewise linear compensation sink current IPWL_SINK to flow from the bandgap reference circuit 102 to the output node 328. By drawing current from the bandgap reference circuit 102, the amplitude of the VBIAS at the bandgap reference circuit 102 can be regulated (e.g., set) based on the piecewise linear compensation sink current IPWL_SINK, such as when the temperature of the voltage reference device 100 is at or greater than the second knee point temperature T2.

In some examples, the trim DAC output circuit 326 can be configured to receive a source high signal source_HIZ, such as when the temperature of the voltage reference device 100 is at or greater than the second knee point temperature T2. The source high signal SOURCE_HIZ can be provided to a gate of the transistor MP47. The transistor MP47 can be activated responsive to the source high signal SOURCE_HIZ to cause a piecewise linear compensation source current IPWL_SOURCE to flow to the bandgap reference circuit 102. By providing current to the bandgap reference circuit 102, the amplitude of the VBIAS at the bandgap reference circuit 102 can be regulated (e.g., set) based on the piecewise linear compensation source current IPWL_SOURCE, such as when the temperature of the voltage reference device 100 is at or greater than the second knee point temperature T2.

In some examples, the trim DAC output circuit 326 can be configured to receive a sink low signal source_LOZ, such as when the temperature of the voltage reference device 100 is at or less than the first knee point temperature T1. The sink low signal source_LOZ can be provided to a gate of the transistor MP48. The transistor MP48 can be activated responsive to the sink low signal source_LOZ to cause the piecewise linear compensation sink current IPWL_SINK to flow from the bandgap reference circuit 102 to the output node 328. By drawing current from the bandgap reference circuit 102, the amplitude of the VBIAS at the bandgap reference circuit 102 can be regulated (e.g., set) based on the piecewise linear compensation sink current IPWL_SINK, such as when the temperature of the voltage reference device 100 is at or less than the first knee point temperature T1.

In some examples, the trim DAC output circuit 326 can be configured to receive a source low signal source_LOZ, such as when the temperature of the voltage reference device 100 is at or less than the first knee point temperature T1. The source low signal source_LOZ can be provided to a gate of the transistor MP49. The transistor MP49 can be activated responsive to the source low signal source_LOZ to cause the piecewise linear compensation source current IPWL_SOURCE to flow to the bandgap reference circuit 102. By providing current to the bandgap reference circuit 102, the amplitude of the VBIAS at the bandgap reference circuit 102 can be regulated (e.g., set) based on the piecewise linear compensation source current IPWL_SOURCE, such as when the temperature of the voltage reference device 100 is at or less than the first knee point temperature T1.

Accordingly, the trim DAC 300 can be configured to source or sink linear compensation current IPWL_SOURCE and IPWL_SINK to the bandgap reference for piecewise linear compensation of the bandgap reference voltage VBG. For example, the trim DAC 300 is be configured to source or sink linear compensation current IPWL_SOURCE and IPWL_SINK over the second range that extends below the first temperature T1 to the third temperature T3 (e.g., T3<T1), and the third range that extends above the second temperature T2 to the fourth temperature T4 (e.g., T4>T2).

In some examples, the trim DAC 300 can include an offset compensation current circuit 336. The offset compensation current circuit 336 can be used to compensate for gate node floating at the gates of the transistors of the trim DAC 300, such as the transistors MP31, MP32, and MP33. For example, when the temperature of the voltage electronic device 100 is at a temperature between the first and second knee point temperatures T1 and T2 (e.g., the first temperature range, as described herein), no linear compensation current IOUT1 is provided to the trim DAC 300, which can result in a leakage of current at the output node 328. By configuring the trim DAC 300 with the offset compensation current circuit 336 leakage of the current at the output node 328 can be mitigated or reduced for temperatures between the first and second knee point temperatures T1 and T2. The offset compensation current circuit 336 includes transistors MPO31, MPO32, and MPO33. As an example, the transistors MPO31, MPO32, and MPO33 are PFETs or PMOS transistors. Respective sources of the transistors MPO31, MPO32, and MPO33 can be coupled to the supply node 308. A gate of the transistors MPO31, MP32, and MPO33 can be coupled to a drain of the transistor MPO31. A source of the transistors MPO33 can be coupled to the node 310.

As a further example, the offset compensation current circuit 336 includes transistors MNO31 and MNO32. As an example, the transistors MNO31 and MNO32 are NFETs or NMOS transistors. Respective gates of the transistors MNO31 and MNO32 transistors can be coupled to a source of the transistor MPO32. A drain of the transistor MNO31 can be coupled to the gate of the transistor MNO31 and the source of the transistor MPO32. Respective sources of the transistors MNO31 and MNO32 can be coupled to the ground 312. A drain of the transistor MNO32 can be coupled to the drains of the transistors MP45 and MP47, the drain of the transistor MN31, and the gates of the transistors MN31 and MN32. As an example, an offset current I_OFFSET is established to flow away from a node 338, such as by a current source (not shown in FIG. 3). The offset current I_OFFSET can be a negative current and activate respective gates of the transistors MPO31, MPO32, and MPO33. A temperature current I_TEMP can be provided to the node 310 to mitigate current leakage responsive to the activation of the transistor MPO33 and the offset current I_OFFSET.

Figure 4:
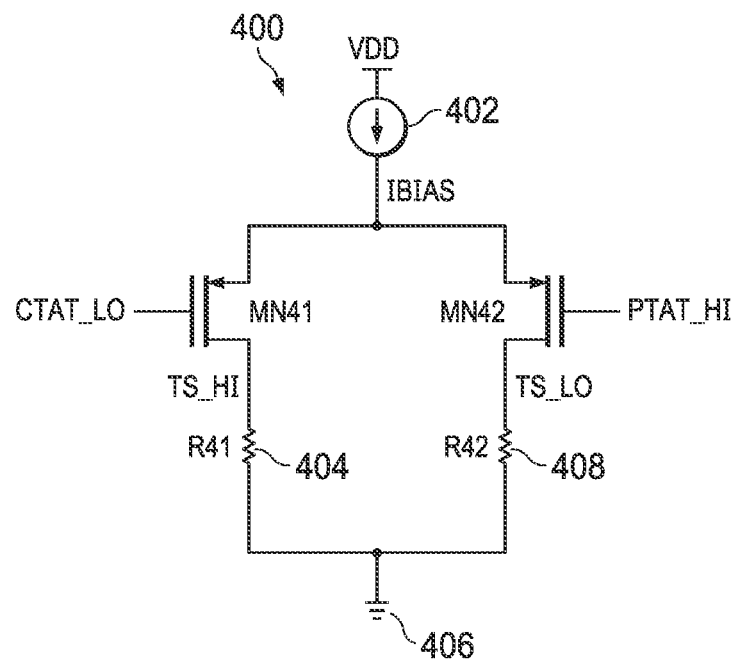
FIG. 4 is a schematic diagram of a temperature sense generation circuit.

FIG. 4 is a schematic diagram of a temperature sense generation circuit 400 that can be employed to generate a temperature sense high signal TS_HI and a temperature sense low signal TS_LO responsive to PTAT_LO and CTAT_HI voltages, respectively. The temperature sense high and low signals TS_HI and TS_LO are an example of the temperature sense high and low signals TS_HI and TS_LO, as shown in FIGS. 1, 2 and 3. Therefore, the following description of FIG. 4 also refers to FIGS. 2 and 3. The temperature sense generation circuit 400 includes transistors MP41 and MP42. The transistors MP41 and MP42 can be implemented as PFETs or PMOS transistors. The transistors MP41 and MP42 have respective sources coupled to a bias current source 402. The bias current source 402 can be configured to provide a current bias IBIAS responsive to a supply voltage VDD. The temperature sense generation circuit 400 includes a resistor 404 with a resistance R41 coupled between a drain of the transistor MP41 and a ground 406. The temperature sense generation circuit 400 includes a resistor 408 with a resistance R42 coupled between a drain of the transistor MP42 and the ground 408. A gate of the transistor MP41 can receive the CTAT_LO voltage and a gate of the transistor MP42 can receive the PTAT_HI voltage.

In some examples, when a temperature of the voltage reference device 100 is at or below the first knee point temperature T1 (e.g., 25 degrees Celsius), the gate of the transistor MP41 is configured to receive the CTAT_LO voltage with a high signal value. The MP41 can be configured to provide the current bias IBIAS to the resistor 404 to establish the temperature sense high signal TS_HI with a high signal value. The temperature sense generation circuit 400 can be configured to provide the temperature sense high signal TS_HI over the third temperature range (e.g., from about T2 to about T4 (e.g., 125 degrees Celsius). In some examples, when the temperature of the voltage reference device 100 is at or greater than the second knee point temperature T2 (e.g., 90 degrees Celsius), the gate of the transistor MP42 is configured to receive the PTAT_HI voltage with a high signal value. The MP42 can be configured to provide the current bias IBIAS to the resistor 408 to establish the temperature sense high signal TS_LO with a high signal value. The temperature sense generation circuit 400 can be configured to provide the temperature sense low signal TS_LO over the second temperature range (e.g., from about T1 to about T3 (e.g., −40 degrees Celsius)).

Figure 5:
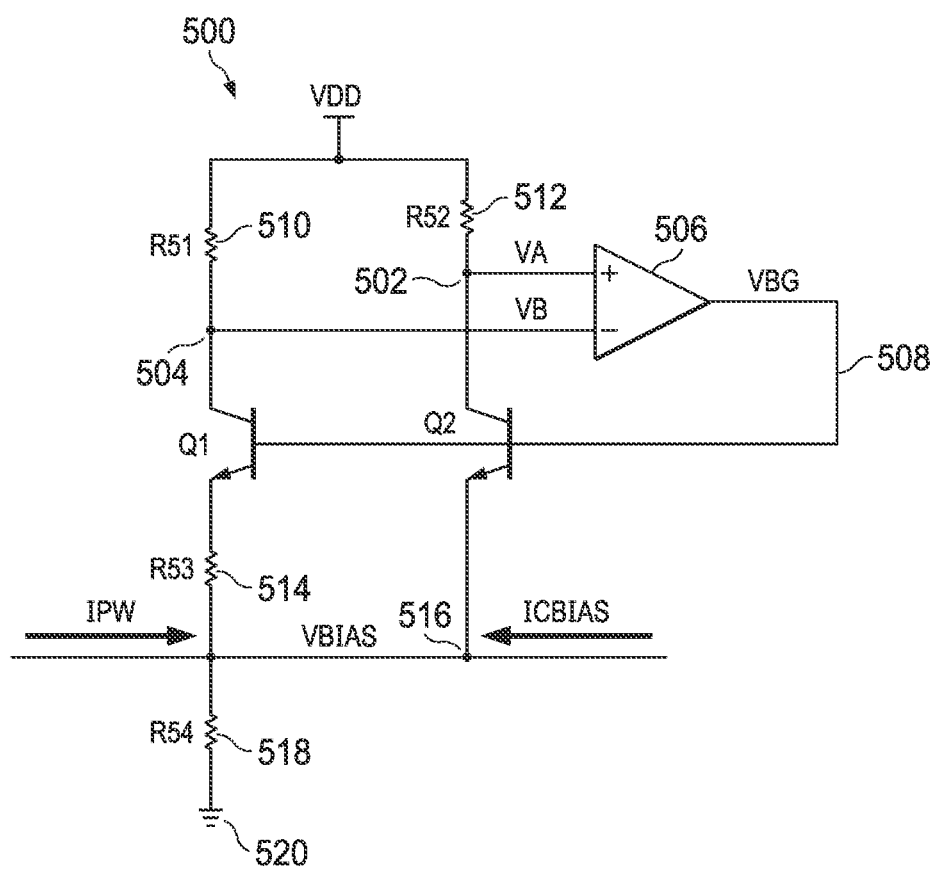
FIG. 5 is a schematic diagram of a bandgap reference circuit.

FIG. 5 is a schematic diagram of a bandgap reference circuit 500. The bandgap reference circuit 500 is an example of the bandgap reference circuit 102, as shown in FIG. 1. Therefore, the following description of FIG. 5 also refers to FIG. 1. The bandgap reference circuit 500 includes a first internal node 502 with a first voltage VA in a first circuit branch and a second internal node 504 with a second voltage VB in a second circuit branch. The bandgap reference circuit 500 further includes a transconductance amplifier (GMA) 506, which includes an inverting (e.g., "−") input terminal coupled to the first internal node 502 and a non-inverting (e.g., "+") input terminal coupled to the second internal node 504. An output node 508 of the transconductance amplifier 506 can be coupled to the output terminal 112 of the voltage reference device 100, as shown in FIG. 1. In operation, when the bandgap reference circuit 500 is powered, the output node 508 provides the bandgap reference voltage VBG.

In some examples, the bandgap reference circuit 500 includes first and second transistors Q1 and Q2. In some examples, the transistors Q1 and Q2 are a matched pair of pnp bipolar transistors. Resistors 510 and 512 with a respective resistance R51 and R52 are coupled to receive a supply voltage VDD. The transistor Q1 can be diode-connected, with an emitter of the transistor Q1 coupled to resistor 510 and the inverting input terminal of the transconductance amplifier 506, and a base coupled to a base of the transistor Q2. The transistor Q2 can be diode-connected, with an emitter of the transistor Q2 coupled to the resistor 512 and the non-inverting input terminal of the transconductance amplifier 506. The emitter of the transistor Q1 is coupled to the second internal node 504 and the emitter of the transistor Q2 is coupled to the first internal node 502.

As a further example, a collector of the transistor Q1 is coupled to a resistor 514 with a resistance R53, and a collector of the transistor Q2 is coupled to a third internal node 516. The third internal node 516 of the bandgap reference circuit 500 can be referred to herein as a bias input node. The collector of the transistor Q1 is coupled via the resistor 514 to the bias input node 516. A fourth resistor 518 or a bias resistor with a resistance R54 is coupled between the bias input node 516 and a ground 520. In some examples, the bias resistor 518 forms part of or is the biasing circuit 108, as shown in FIG. 1. A current through the bias resistor 518 from the first and second circuit branches of the bandgap reference circuit 500 and any additional bias current(s) applied to the bias input node 516 (e.g., sourced and/or sinked) set a voltage across the bias resistor 518 and hence a bias voltage VBIAS of the bias input node 516 relative to the ground 520.

In some examples, the output 186 of the piecewise compensation circuit 116 is configured to provide the piecewise compensation signal IPW to the bias input node 516 of the bandgap reference circuit 500. The output 194 of the summer circuit 192 is configured to provide the bias compensation current ICBIAS to the bias input node 516. In this example, the bias input node 516 facilitates temperature compensation for 0th, 1st, 2nd, and higher-order thermal effects in the voltage reference device 100 to mitigate temperature drift of the bandgap reference voltage signal VBG and provide a high precision voltage reference with ultra-low temperature drift. In particular, the bias compensation current ICBIAS can be provided to the bias input node 516 to compensate for 0th, 1st, and 2nd order thermal effects on the bandgap reference voltage VBG, and the piecewise compensation signal IPW can be provided to the bias input node 516 to compensate for higher-order thermal effects on the bandgap reference voltage signal VBG. Accordingly, a correct signal or signals can be added to the bias input node 516 to regulate (e.g., control) the amplitude of the bandgap reference voltage signal VBG at the output node 508.

Figure 6:
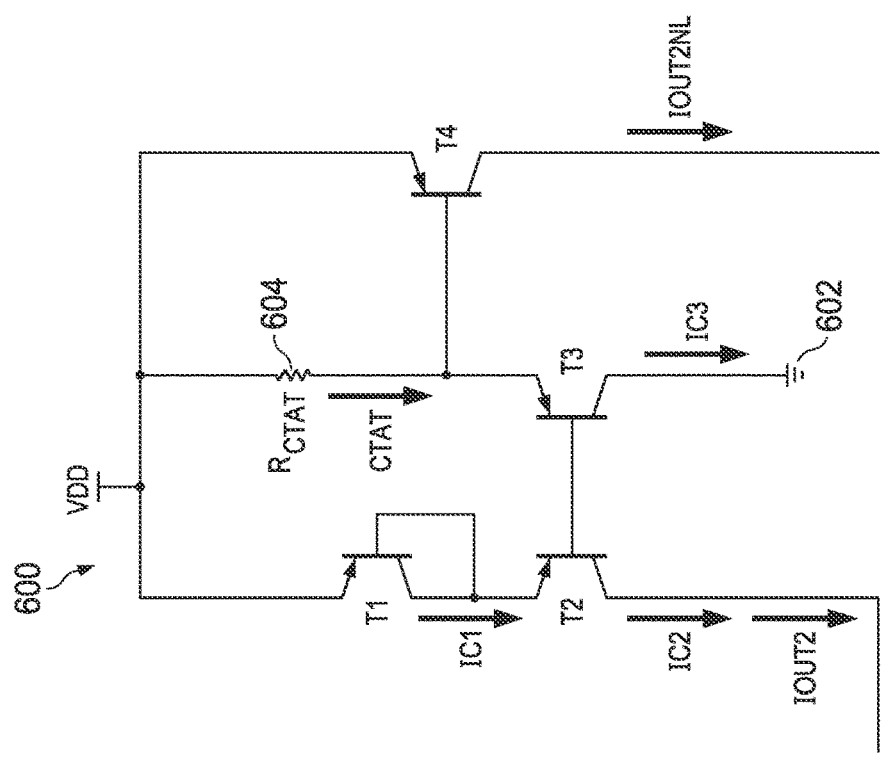
FIG. 6 is a schematic diagram of a current squarer circuit.

FIG. 6 is a schematic diagram of a current squarer circuit 600. The current squarer circuit 600 is an example of the current squarer circuit 172 of the piecewise compensation circuit 116, as shown in FIG. 1. Therefore, the following description of FIG. 6 also refers to FIG. 1. The current squarer circuit 600 includes a first transistor T1 with a collector current IC1 to receive a supply voltage VDD and a diode-connected second transistor T2 with a collector current IC2 representative of the non-linear correction current IOUT2. In some examples, the first and second transistors T1 and T2 are pnp bipolar transistors. A base of transistor T2 is coupled to a base of a third transistor T3 having a collector coupled to a ground 602 with a collector current IC3. A resistor 604 can receive a supply voltage VDD and an emitter of the transistor T3 can be coupled to the transistor T3. The resistor 604 can have a resistance RCTAT. A current CTAT can flow to the emitter of the transistor T3 through the resistor 604 responsive to the supply voltage VDD. A fourth transistor T4 can have an emitter that can receive the supply voltage VDD, with a collector current representative of the squared non-linear correction current IOUT2NL. In some examples, the third and fourth transistors T3 and T4 are pnp bipolar transistors. The fourth transistor T4 can have a base coupled to the emitter of transistor T3, and a collector that can provide the squared non-linear correction current IOUT2NL to the trim DAC 175, as described herein.

Figure 7:
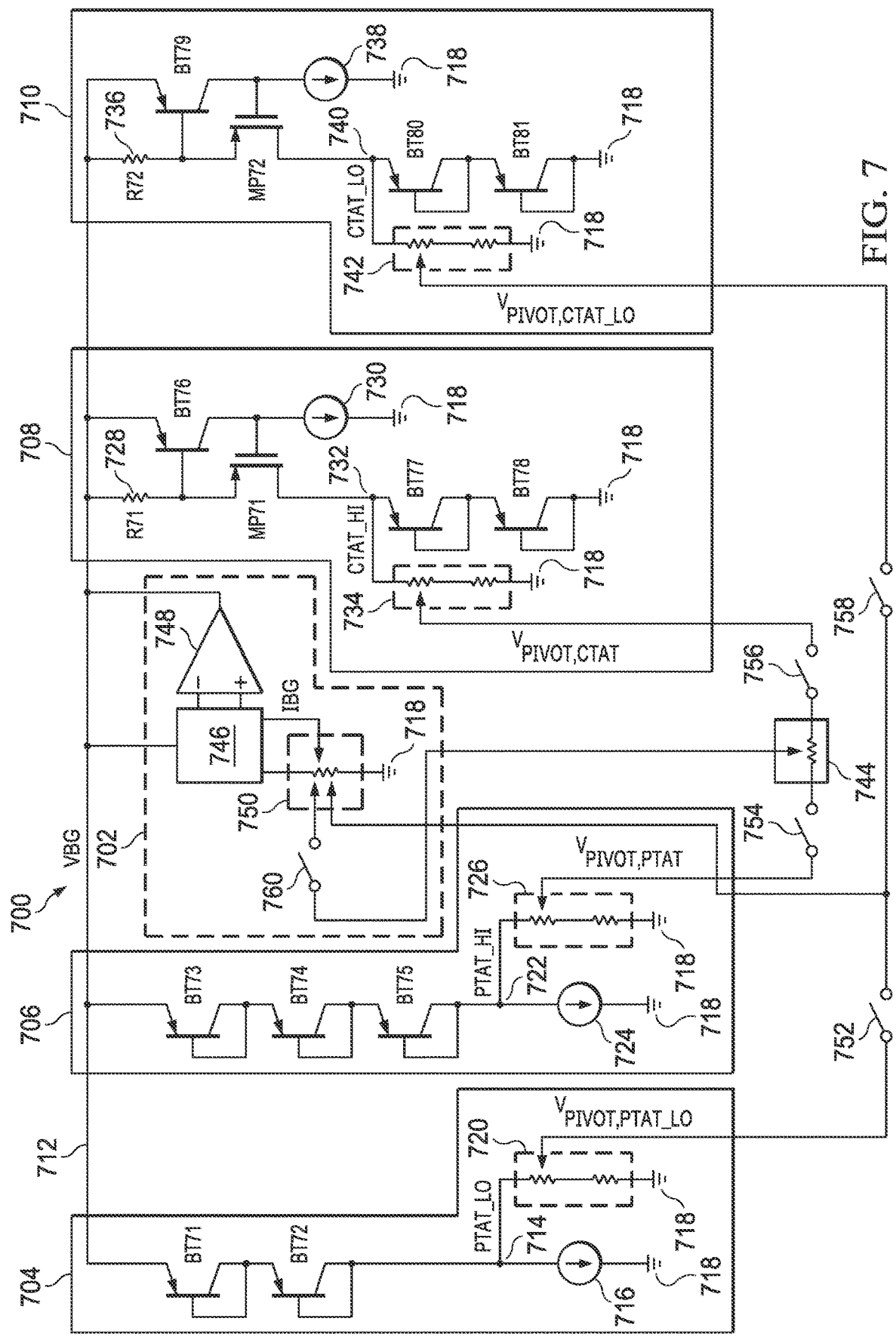
FIG. 7 is a schematic diagram of a temperature compensation circuit.

FIG. 7 is a schematic diagram of a temperature compensation circuit 700 implemented relative to a bandgap output circuit 702. In some examples, the temperature compensation circuit 700 is an example of the two temperature trim DAC 188, as shown in FIG. 1. Therefore, the following description of FIG. 7 also refers to FIG. 1. The temperature compensation circuit 700 includes a PTAT_LO generation circuit 704 for providing a PTAT_LO voltage PTAT_LO, a PTAT_HI generation circuit 706 for providing a PTAT_HI voltage, a CTAT_HI generation circuit 708 for providing a CTAT_HI voltage, and a CTAT_LO generation circuit 710 for providing a CTAT_LO voltage. The PTAT_LO, PTAT_HI, CTAT_LO, and CTAT_LO voltages can be provided to the PWL and PWNL compensation generator circuits 118 and 140, as shown in FIG. 1, such as for linear and non-linear piecewise compensation of the bandgap reference voltage VBG, as described herein.

The PTAT_LO generation circuit 704 includes transistors BT71 and BT72. In some examples, the transistors BT71 and BT72 are implemented as pnp bipolar transistors. An emitter of the transistor BT71 is coupled to a node 712 and a collector of the transistor BT71 is coupled to an emitter of the transistor BT72. A base of the transistor BT71 is coupled to the emitter of the transistor BT72. A base of the transistor BT72 is coupled to a node 714. As shown in FIG. 7, the PTAT_LO voltage can be established at the node 714. A current source 716 is coupled to the node 714 and to a ground 718. The PTAT_LO generation circuit 704 includes a resistive DAC 720. The resistive DAC 720 can be coupled to the node 714 to receive the PTAT_LO voltage and to the ground 718. The resistive DAC 720 can be configured to receive the PTAT_LO voltage. The resistive DAC 720 can be configured as a programmable voltage divider to generate a scaled version of the PTAT_LO voltage identified as $V_{PIVOT,PTAT\_LO}$ in the example of FIG. 7. The resistive DAC 720 can be configured to scale the PTAT_LO voltage, such that the scaled version of the PTAT_LO voltage is equal to a reference voltage VREF at a selected temperature.

The PTAT_HI generation circuit 706 includes transistors BT73, BT74, and BT75. In some examples, the transistors BT73, BT74, and BT75 are implemented as pnp bipolar transistors. An emitter of the transistor BT73 is coupled to the node 712 and a collector of the transistor BT73 is coupled to an emitter of the transistor BT74. A collector of the transistor BT74 is coupled to an emitter of the transistors BT75. A gate of the transistor BT73 is coupled to the emitter of the transistor BT74. A gate of the transistor BT74 is coupled to the emitter of the transistor BT75. A gate of the transistor BT75 is coupled to a node 722. As shown in FIG. 7, the PTAT_HI voltage can be established at the node 722. A current source 724 is coupled to the node 722 and the ground 718. The PTAT_LO generation circuit 704 includes a resistive DAC 726. The resistive DAC 726 can be coupled to the node 722 to receive the PTAT_HI voltage and to the ground 718. The resistive DAC 726 can be configured as a programmable voltage divider to generate a scaled version of the PTAT_HI voltage identified as $V_{PIVOT,PTAT}$ in the example of FIG. 7. The resistive DAC 726 can be configured to scale the PTAT_HI voltage, such that the scaled version of the PTAT_LO voltage is equal to the reference voltage VREF at the selected temperature.

The CTAT_HI generation circuit 708 includes transistors BT76, BT77, and BT78. In some examples, the transistors BT76, BT77, and BT78 are implemented as pnp bipolar transistors. The CTAT_HI generation circuit 708 further includes a transistor MP71. As an example, the transistors MP71 is implemented as a PFET or a PMOS transistor. A source of the transistor MP71 can be coupled via a resistor 728 with a resistance R71 to the node 712. An emitter of the transistor BT76 can be coupled to the node 712 and a base of the transistor BT76 can be coupled to the source of the transistor MP71. A gate of the transistor MP71 can be coupled to the collector of the transistor BT76. The gate of the transistor MP71 and the collector of the transistor BT76 can be coupled to a current source 730, which is coupled to the ground 718. The drain of the transistor MP71 is coupled to a node 732. As shown in FIG. 7, the CTAT_HI voltage can be established at the node 732. An emitter of the transistor BT77 is coupled to the node 732. A collector of the transistor BT77 is coupled to an emitter of the transistor BT78. A collector of the transistor BT78 is coupled to the ground 718. A gate of the transistor BT77 is coupled to the emitter of the transistor BT78, and the gate of the transistor BT78 is coupled to the ground 718. The CTAT_HI generation circuit 708 includes a resistive DAC 734. The resistive DAC 734 can be coupled to the node 732 to receive the CTAT_HI voltage and to the ground 718. The resistive DAC 734 can be configured as a programmable voltage divider to generate a scaled version of the CTAT_HI voltage identified as $V_{PIVOT,CTAT}$ in the example of FIG. 7. The resistive DAC 734 can be configured to scale the CTAT_HI voltage, such that the scaled version of the CTAT_HI voltage is equal to the reference voltage VREF at the selected temperature.

The CTAT_LO generation circuit 710 includes transistors BT79, BT80, and BT81. In some examples, the transistors BT79, BT80, and BT81 are implemented as pnp bipolar transistors. The CTAT_LO generation circuit 710 further includes a transistor MP72. As an example, the transistor MP72 is implemented as a PFET or a PMOS transistor. A source of the transistor MP72 can be coupled via a resistor 736 with a resistance R72 to the node 712. An emitter of the transistor BT79 can be coupled to the node 712 and a base of the transistor BT79 can be coupled to the source of the transistor MP72. A gate of the transistor MP72 can be coupled to the collector of the transistor BT79. The gate of the transistor MP72 and the collector of the transistor BT79 can be coupled to a current source 738, which is coupled to the ground 718. The drain of the transistor MP72 is coupled to a node 740. As shown in FIG. 7, the CTAT_LO voltage can be established at the node 740. An emitter of the transistor BT80 is coupled to the node 740. A collector of the transistor BT80 is coupled to an emitter of the transistor BT81. A collector of the transistor BT81 is coupled to the ground 718. A gate of the transistor BT80 is coupled to the emitter of the transistor BT81, and the gate of the transistor BT81 is coupled to the ground 718. The CTAT_LO generation circuit 710 includes a resistive DAC 742. The resistive DAC 742 can be coupled to the node 732 to receive the CTAT_LO voltage and to the ground 718. The resistive DAC 740 can be configured as a programmable voltage divider to generate a scaled version of the CTAT_LO voltage identified as $V_{PIVOT,CTAT\_LO}$ in the example of FIG. 7. The resistive DAC 742 can be configured to scale the CTAT_LO voltage, such that the scaled version of the CTAT_LO voltage is equal to the reference voltage VREF at the selected temperature.

As a further example, the temperature compensation circuit 700 includes a resistive DAC 744. The resistive DAC 744 is coupled to an output of the resistive DAC 726 to receive the scaled version of the PTAT_HI voltage and is coupled to an output of the resistive DAC 734 to receive the scaled version of the CTAT_HI voltage. An output of the resistive DAC 744 is configured to provide an output voltage (e.g., that changes with temperature) and is feedback to bandgap output circuit 702, as shown in FIG. 7.

The bandgap output circuit 702 can include a bandgap reference circuit 746, a buffer amplifier 748, and a resistive DAC 750. In some examples, the bandgap reference circuit 746 is the bandgap reference circuit 102, as shown in FIG. 1. The bandgap reference circuit 746 is configured to generate the bandgap reference voltage VBG and the buffer amplifier 748 is configured to isolate the bandgap reference circuit 746 from loading effects of circuits external to the bandgap reference circuit 746. The resistive DAC 750 provides for adjustment of the bandgap reference voltage VBG generated by the bandgap reference circuit 746 at a selected temperature. For example, the bandgap reference circuit 746 includes a plurality of resistors coupled in series and respective tap points between each pair of resistors. A tap point at which the bandgap current IBG is provided to the resistive DAC converter 326 is selected to produce bandgap reference voltage VBG that equals the reference voltage.

The temperature compensation circuit 700 includes a switch 752, a switch 754, a switch 756, a switch 758, and a switch 760 to allow for selectable isolation of the resistive DAC 720, the resistive DAC 726, the resistive DAC 734, and the resistive DAC 744. The switch 752 switchably couples the scaled version of the PTAT_LO voltage to the resistive DAC 750. The switch 754 switchably couples the scaled version of the PTAT_HI voltage to the resistive DAC 744. The switch 756 switchably couples the scaled version of the CTAT_HI voltage to the resistive DAC 744. The switch 758 switchably couples the scaled version of the CTAT_LO voltage to the resistive DAC 750.

In some examples, when a temperature of the voltage electronic device 100 is at or below the first knee point temperature T1 (e.g., 25 degrees Celsius), the switch 752, and the switch ST, are activated (e.g., closed). An amplitude of the PTAT_LO voltage at the node 714 can be based on the bandgap reference voltage VBG and a reference voltage VD. The reference voltage VD can be an emitter-based voltage VEB of a respective pnp transistor that can be connected in a diode fashion (base and collector are connected together). For example, the PTAT_LO voltage at the node 714 can be represented as VPTAT_LO=VBG−2VD. The resistive DAC 720 can be configured to scale the PTAT_LO voltage until the scaled version of the PTAT_LO voltage is equal to the reference voltage. In some examples, the scaled version of the PTAT_LO voltage can be provided to the bandgap output circuit 702. The resistive DAC 750 can be configured to adjust the bandgap reference voltage VBG responsive to the scaled version of the PTAT_LO voltage.

In some examples, when the temperature of the voltage electronic device 100 is at or below the first knee point temperature T1, the switch ST_LO, and the switch 758, are activated (e.g., closed). An amplitude of the CTAT_LO voltage can be based on the reference voltage VD. For example, the CTAT_LO voltage at the node 740 can be represented as VCTAT_LO=2VD. The resistive DAC 742 can be configured to scale the CTAT_LO voltage until the scaled version of the CTAT_LO voltage is equal to the reference voltage VREF. The scaled version of the CTAT_LO voltage can be provided to the bandgap output circuit 702. The resistive DAC 750 is configured to adjust the bandgap reference voltage VBG responsive to the scaled version of the CTAT_LO voltage.

In some examples, when the temperature of the voltage electronic device 100 is at or above the second knee point temperature T2 (e.g., 90 degrees Celsius), the switch 756, and the switch 760 are activated (e.g., closed). An amplitude of the CTAT_HI voltage can be based on the reference voltage VD. For example, the CTAT_HI voltage at the node 732 can be represented as VCTAT_HI=2VD. The resistive DAC 734 can be configured to scale the CTAT_HI voltage until the scaled version of the CTAT_HI voltage is equal to the reference voltage VREF. The scaled version of the CTAT_HI voltage can be provided to the bandgap output circuit 702. The resistive DAC 750 is configured to adjust the bandgap reference voltage VBG responsive to the scaled version of the CTAT_HI voltage.

In some examples, when the temperature of the voltage electronic device 100 is at or above the second knee point temperature T2 (e.g., 90 degrees Celsius), the switch 754, and the switch 760 are activated (e.g., closed). An amplitude of the PTAT_HI voltage can be based on the reference voltage VD and the bandgap output voltage VBG. For example, the PTAT_HI voltage at the node 722 can be represented as VPTAT_HI=VBG−3VD. The resistive DAC 726 can be configured to scale the PTAT_HI voltage until the scaled version of the PTAT_HI voltage is equal to the reference voltage VREF. The scaled version of the PTAT_HI voltage can be provided to the bandgap output circuit 702. The resistive DAC 750 is configured to adjust the bandgap reference voltage VBG responsive to the scaled version of the PTAT_HI voltage.

Figure 8:
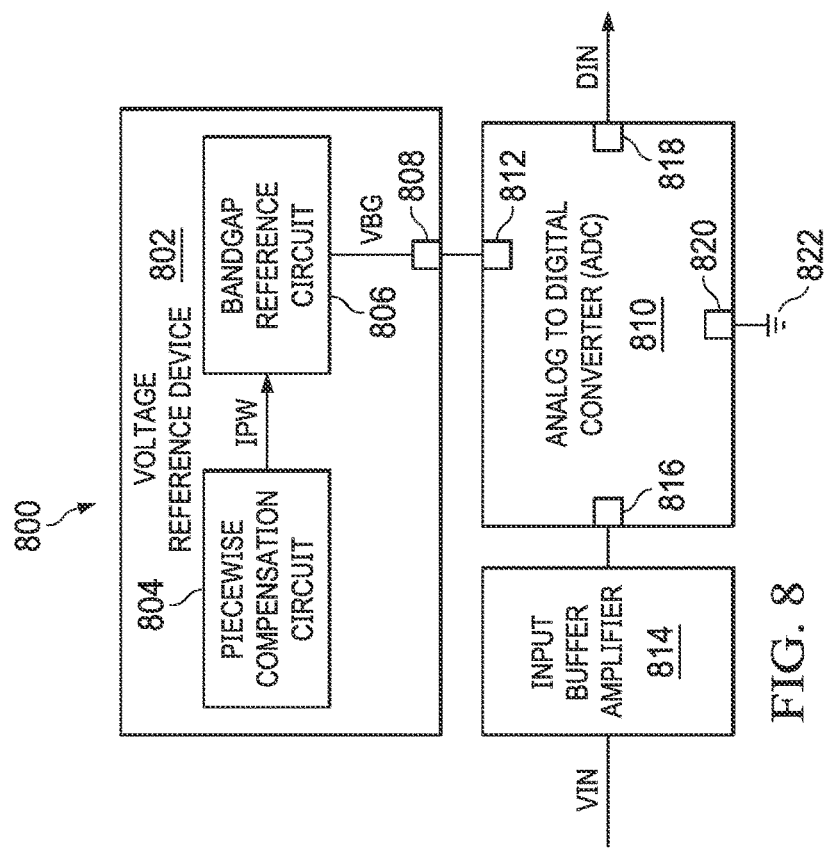
FIG. 8 is a block diagram of an ADC system.

FIG. 8 is a schematic diagram of an ADC system 800. For example, the ADC system 800 can be used in high-precision systems, such as medical systems (e.g., X-ray and ultrasound imaging systems), testing and measurement equipment, data acquisition systems, liquid crystal display (LCD) testers, battery testers, and weight scales. The ADC system 800 can be used in other systems for converting an analog signal to a digital signal. The ADC system 800 includes a voltage reference device 802. The voltage reference device 802 can be the voltage reference device 100, as shown in FIG. 1. Therefore, the following description of FIG. 8 also refers to FIG. 1.

The voltage reference device 802 can include a piecewise compensation circuit 804. The piecewise compensation circuit 804 can be the piecewise compensation circuit 116, as shown in FIG. 1. The piecewise compensation circuit 116 can be configured to provide a piecewise compensation signal IPW to a bandgap reference circuit 806 of the voltage reference device 806. The bandgap reference circuit 806 can be the bandgap reference circuit 102, as shown in FIG. 1. The piecewise compensation signal IPW can compensate for high order thermal effects on a bandgap reference voltage VBG provided by the bandgap reference circuit 806 by controlling an amplitude of the bandgap reference voltage VBG over one or more temperature ranges (e.g., T3 to T1, and/or T2 to T4, as described herein). The bandgap reference circuit 806 can be configured to provide the bandgap reference voltage VBG at an output terminal 808 of the voltage reference device 802. The output terminal 808 is an example of the output terminal 112, as shown in FIG. 1. The ADC system 800 includes an ADC 810 having a voltage reference input 812 that is coupled to the output terminal 808 of the voltage reference device 802. The ADC 810 can receive the bandgap reference voltage VBG at the voltage reference input 812. In some examples, the bandgap reference circuit 806 can be configured to generate the bandgap reference voltage VBG compensated for 0th, 1st, 2nd order, and/or higher-order thermal effects.

The ADC system 800 can include an input buffer amplifier circuit 814 that can receive an analog input voltage signal VIN to be measured by the ADC 810. The input buffer amplifier circuit 814 can buffer the analog input voltage signal VIN to be measured. An output of the input buffer amplifier circuit 814 can provide a buffered analog input voltage signal to a conversion input 816 of the ADC 810. The ADC 810 can process the buffered analog input voltage signal relative to the bandgap reference voltage VBG to provide a digital input voltage signal DIN at a converted output 818 of the ADC 802. As shown in FIG. 8, the ADC 802 can have a reference input 820 that can be coupled to a ground 822.

Figure 9:
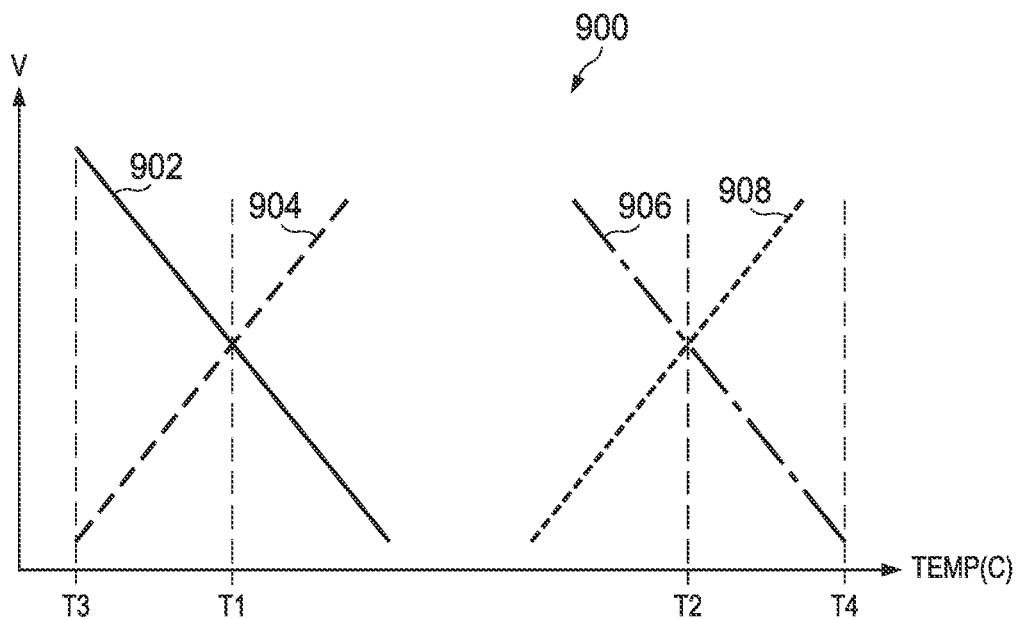
FIG. 9 is a signal diagram showing proportional-to-absolute-temperature (PTAT) and complementary-to-absolute-temperature (CTAT) voltages as a function of temperature.

FIG. 9 is a signal diagram 900 of PTAT and CTAT voltages as a function of temperature. As shown in the example of FIG. 9, an y-axis of the signal diagram 900 represents a voltage in volts (V), and a x-axis of the signal diagram 900 represents a temperature in Celsius (C). The signal diagram 900 includes a first temperature range from a temperature T1 (e.g., 25 degrees C.) to a temperature T2 (e.g., 90 degrees C.), a second temperature range below T1 to a third temperature T3 (e.g., −25 degrees C.), and a third temperature range that extends above the second temperature T2 to a fourth temperature T4 (e.g., 125 degrees C.). In the example signal diagram 900, temperatures T1 and T2 can be referred to as knee point temperatures.

The signal diagram 900 includes a CTAT_LO voltage 902 and PTAT_LO voltage 904. The CTAT_LO and PTAT_LO voltages 902 and 904 are an example of the CTAT_LO and PTAT_LO voltages, as shown in FIG. 1. Therefore, the following description of FIG. 9 also refers to FIG. 1. A crossing point of the CTAT_LO and the PTAT_LO voltages 902 and 904 can be at about the knee point temperature T1 at which the CTAT_LO and PTAT_LO voltages 902 and 904 are equal. For example, as a temperature of the voltage reference device 100 decreases (e.g., below the first knee point temperature T1), an amplitude of the CTAT_LO voltage 902 increases, and an amplitude of the PTAT_LO voltage 904 decreases. In some examples, when the amplitude of the CTAT_LO voltage 902 is greater than the amplitude of the PTAT_LO voltage 904, the piecewise compensation current IPW is provided to the bandgap reference circuit 92 to counteract an amplitude variation of the bandgap reference voltage VBG over the second temperature range.

The signal diagram 900 further includes a CTAT_HI voltage 906 and PTAT_HI voltage 908. The CTAT_HI and PTAT_HI voltages 906 and 908 are examples of the CTAT_LO and PTAT_LO voltages, as shown in FIG. 1. A crossing point of the CTAT_HI and the PTAT_HI voltages 906 and 908 can be at about the second knee point temperature T2 at which the CTAT_HI and PTAT_HI voltages 906 and 908 are equal. By way of example, as the temperature of the voltage reference device 100 increases (e.g., above the second knee point temperature T2), an amplitude of the PTAT_HI voltage 908 increases, and an amplitude of the CTAT_HI voltage 906 decreases. In some examples, when the amplitude of the PTAT_HI voltage 908 is greater than the amplitude of the CTAT_HI voltage 906, the piecewise compensation current IPW is provided to the bandgap reference circuit 92 to counteract the amplitude variation of the bandgap reference voltage VBG over the third temperature range.

Figure 10:
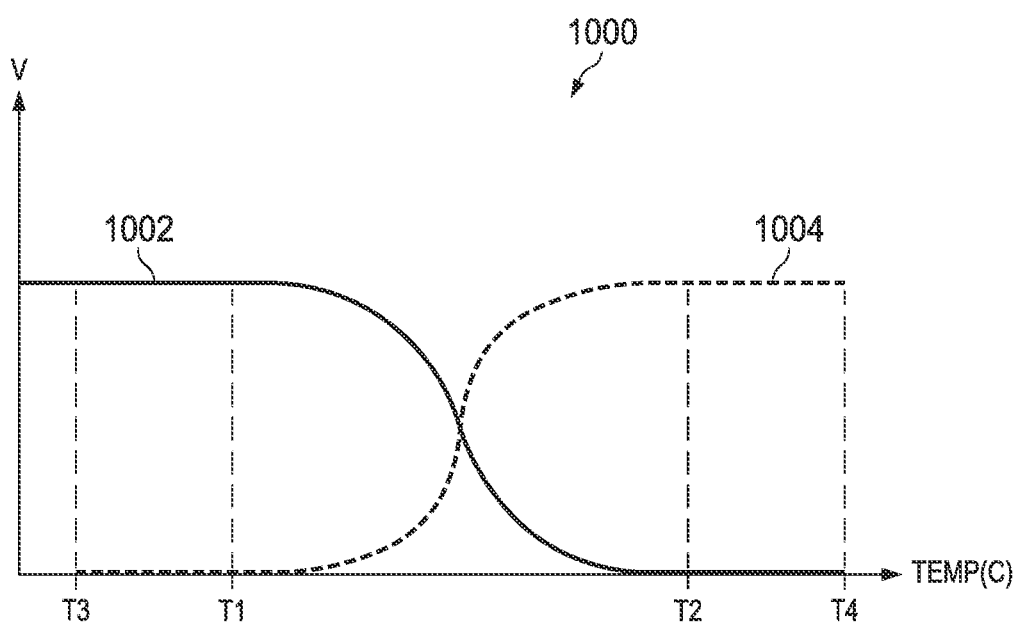
FIG. 10 is a signal diagram showing high and low temperature sense signals as a function of temperature.

FIG. 10 is a signal diagram 1000 of high and low temperature sense signals as a function of temperature. As shown in the example of FIG. 10, an y-axis of the signal diagram 1000 represents a voltage in volts (V), and a x-axis of the signal diagram 1000 represents a temperature in Celsius (C). The signal diagram 1000 includes a first temperature range from a temperature T1 (e.g., 25 degrees C.) to a temperature T2 (e.g., 90 degrees C.), a second temperature range below T1 to a third temperature T3 (e.g., −25 degrees C.), and a third temperature range that extends above the second temperature T2 to a fourth temperature T4 (e.g., 125 degrees C.). In the example signal diagram 1000, temperatures T1 and T2 can be referred to as knee point temperatures. The signal diagram 1002 includes a temperature sense low signal TS_LO 1002 and a temperature sense high signal TS_HI 1004. The temperature sense high and low signals TS_HI and TS_LO are examples of the temperature sense high and low signals TS_HI and TS_LO, as shown in FIGS. 2, 3, and 4. Therefore, the following description of FIG. 10 also refers to FIGS. 2, 3, and 4.

As an example, as the temperature of the voltage reference device 100 decreases, the amplitude of the temperature sense low signal TS_LO 1002 increases (e.g., non-linearly) to a first amplitude. As the temperature of the voltage reference device 100 decreases, the amplitude of the temperature sense high signal TS_HI 1004 decreases (e.g., non-linearly) to a second amplitude. At about the first knee point temperature T1, the temperature sense low signal TS_LO 1002 can be at the first amplitude and the temperature sense high signal TS_HI 1004 can be at the second amplitude, which is different from the first amplitude.

As an example, as the temperature of the voltage reference device 100 increases, the amplitude of the temperature sense low signal TS_LO 1002 decreases (e.g., non-linearly) to the second amplitude. As the temperature of the voltage reference device 100 increases, the amplitude of the temperature sense high signal TS_HI 1004 increases (e.g., non-linearly) to the first amplitude. At about the second knee point temperature T2, the temperature sense low signal TS_LO 1002 can be at the second amplitude and the temperature sense high signal TS_HI 1004 can be at the first amplitude. As a further example, the temperature sense low signal TS_LO 1002 has a high signal value (e.g., having an amplitude equal to the first amplitude) and the temperature sense high signal TS_HI 1004 has a low signal value (e.g., having an amplitude equal to the second amplitude) over the second temperature range. The temperature sense low signal TS_LO 1002 has a low signal value (e.g., having an amplitude equal to the second amplitude) and the temperature sense high signal TS_HI 1004 has a high signal value over the second temperature range.

Figure 11:
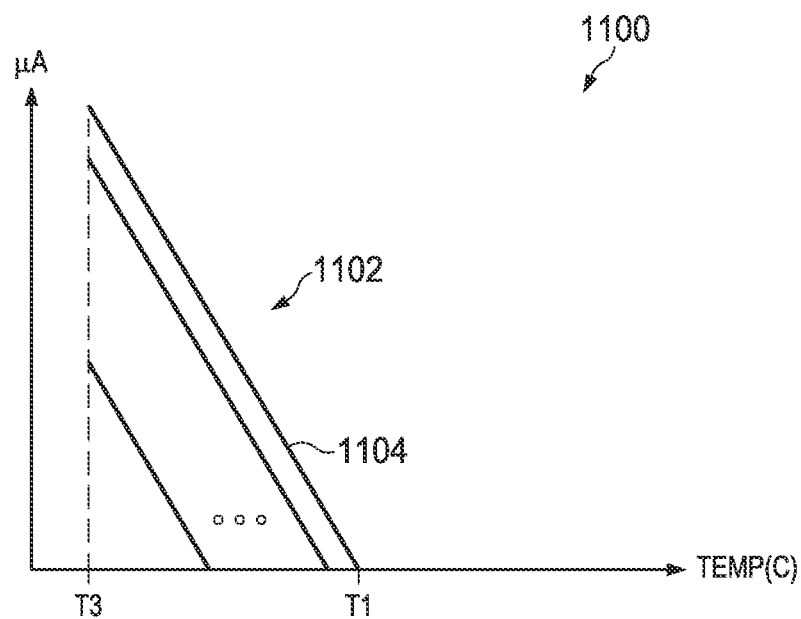
FIG. 11 is a signal diagram showing linear correction currents as a function of temperature for different knee codes.

FIG. 11 is a signal diagram 1100 of linear correction currents IOUT1 1102 as a function of temperature for different knee codes. In some examples, a respective one of the linear correction currents IOUT1 1102 is an example of the linear correction current IOUT1, a shown in FIG. 1. Therefore, the following description of FIG. 11 also refers to FIG. 1. As shown in the example of FIG. 11, an y-axis of the signal diagram 1100 represents a current in microamps (μA) and a x-axis of the signal diagram 1100 represents a temperature in Celsius (C). The signal diagram 1100 includes a second temperature range below T1 (e.g., 25 degrees C.) to a third temperature T3 (e.g., −25 degrees C.). In the example signal diagram 1100, the first temperature T1 can be referred to as a knee point temperature. As described herein, the knee temperature code 126 can set a knee point temperature of the linear correction current IOUT1, as shown in FIG. 1. For example, the PWL compensation generator circuit 118 is configured to deliver a positive linear correction current signal IOUT1 1104 starting at about the first knee point temperature T1 over the second temperature range.

Figure 12:
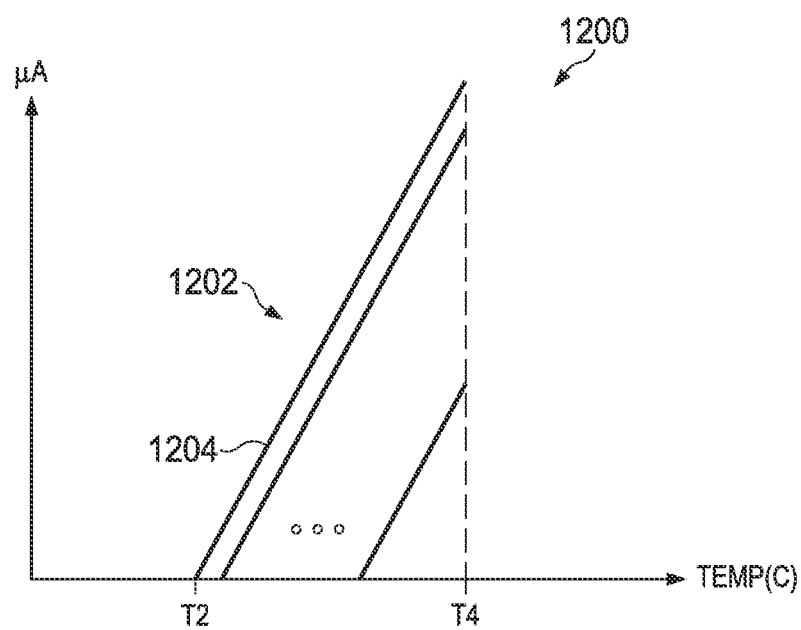
FIG. 12 is another signal diagram showing linear correction currents as a function of temperature for different knee codes.

FIG. 12 is a signal diagram 1200 of linear correction currents IOUT1 1202 as a function of temperature for different knee codes. In some examples, a respective one of the linear correction currents IOUT1 1202 is an example of to the linear correction current IOUT1, a shown in FIG. 1. Therefore, the following description of FIG. 12 also refers to FIG. 1. As shown in the example of FIG. 12, an y-axis of the signal diagram 1200 represents a current in microamps (μA) and a x-axis of the signal diagram 1200 represents a temperature in Celsius (C). The signal diagram 1200 includes a third temperature range that extends above a second temperature T2 (e.g., 90 degrees C.) to a fourth temperature T4 (e.g., 125 degrees C.). In the example signal diagram 1200, the second temperature T2 can be referred to as a knee point temperature. As described herein, the knee point temperature code 128 can set a knee point temperature of the linear correction current IOUT1, as shown in FIG. 1. For example, the PWL compensation generator circuit 118 is configured to deliver a positive linear correction current signal IOUT1 1204 starting at about the second knee point temperature T2 over the third temperature range.

Figure 13:
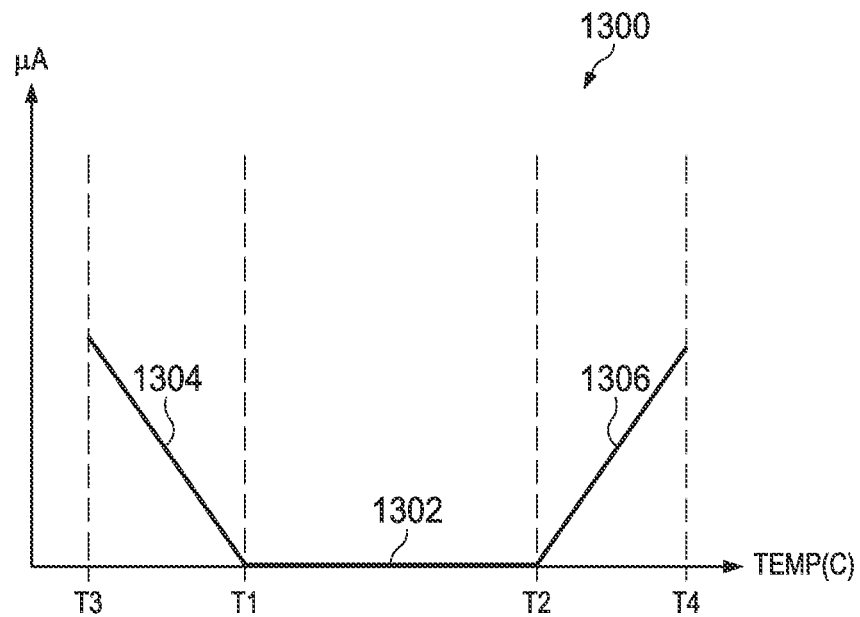
FIG. 13 is a signal diagram showing a piecewise linear compensation current signal sourcing current to a bandgap reference circuit as a function of temperature.

FIG. 13 is a signal diagram 1300 of a piecewise linear compensation current IPWL 1302 sourcing current to the bandgap reference circuit 102, as shown in FIG. 1, as a function of temperature. The piecewise linear compensation current IPWL 1302 is an example of the piecewise linear compensation current IPWL, as shown in FIG. 1. Therefore, the following description of FIG. 13 also refers to FIG. 1. The piecewise linear compensation current IPWL 1302 can be provided by the trim DAC 164, as shown in FIG. 1. As shown in the example of FIG. 13, an x-axis of the signal diagram 1300 represents a current in microamps (μA) and a y-axis of the signal diagram 1300 represents a temperature in Celsius (C). The signal diagram 1300 includes a first temperature range from a temperature T1 (e.g., 25 degrees C.) to a temperature T2 (e.g., 90 degrees C.), a second temperature range below T1 to a third temperature T3 (e.g., −25 degrees C.), and a third temperature range that extends above the second temperature T2 to a fourth temperature T4 (e.g., 125 degrees C.). In the example signal diagram 1300, temperature points T1 and T2 can be referred to as knee point temperatures. As shown in FIG. 13, the piecewise linear compensation current IPWL 1302 includes respective linear portions 1304 and 1306 over the second and third temperature ranges. The linear portion 1304 of the piecewise linear compensation current IPWL 1302 below the first knee point temperature and the linear portion 1306 of the piecewise linear compensation current IPWL 1304 counteract an amplitude variation of the bandgap reference voltage VBG over respective second and third temperature ranges caused by higher-order thermal effects.

Figure 14:
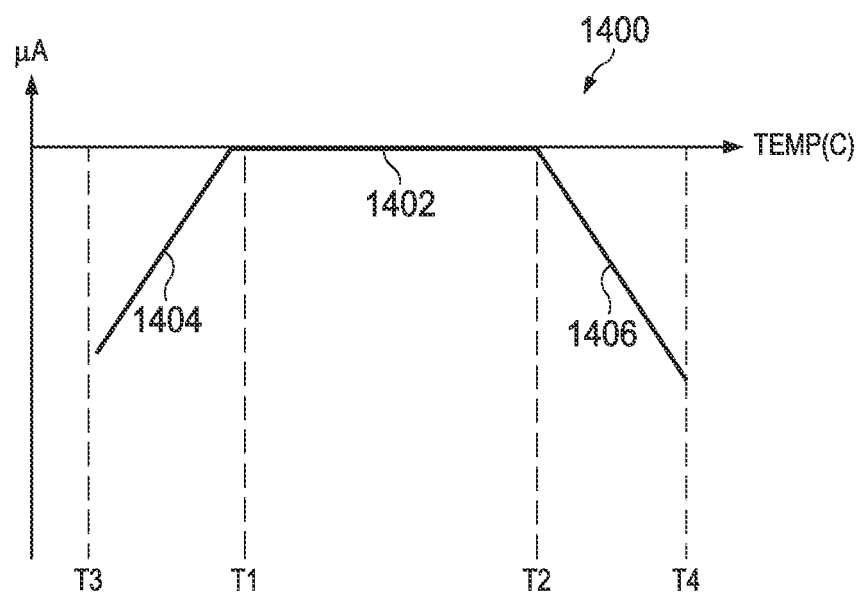
FIG. 14 is a signal diagram showing a piecewise linear compensation current signal sinking current to a bandgap reference circuit as a function of temperature.

FIG. 14 is a signal diagram 1400 of a piecewise linear compensation current IPWL 1402 sinking current to the bandgap reference circuit 102, as shown in FIG. 1, as a function of temperature. The piecewise linear compensation current IPWL 1402 is an example of the piecewise linear compensation current IPWL, as shown in FIG. 1. Therefore, the following description of FIG. 14 also refers to FIG. 1. The piecewise linear compensation current IPWL 1402 can be provided by the trim DAC 164, as shown in FIG. 1. As shown in the example of FIG. 14, an x-axis of the signal diagram 1400 represents a current in microamps (μA) and a y-axis of the signal diagram 1400 represents a temperature in Celsius (C). The signal diagram 1400 includes a first temperature range from a temperature T1 (e.g., 25 degrees C.) to a temperature T2 (e.g., 90 degrees C.), a second temperature range below T1 to a third temperature T3 (e.g., −25 degrees C.), and a third temperature range that extends above the second temperature T2 to a fourth temperature T4 (e.g., 125 degrees C.). In the example signal diagram 1400, temperature points T1 and T2 can be referred to as knee point temperatures. As shown in FIG. 14, the piecewise linear compensation current IPWL 1402 includes respective linear portions 1404 and 1406 over the second and third temperature ranges. The linear portion 1404 of the piecewise linear compensation current IPWL 1402 below the first knee point temperature T2 and the linear portion 1406 of the piecewise linear compensation current IPWL 1404 counteract an amplitude variation of the bandgap reference voltage VBG over respective second and third temperature ranges caused by higher-order thermal effects.

Figure 15:
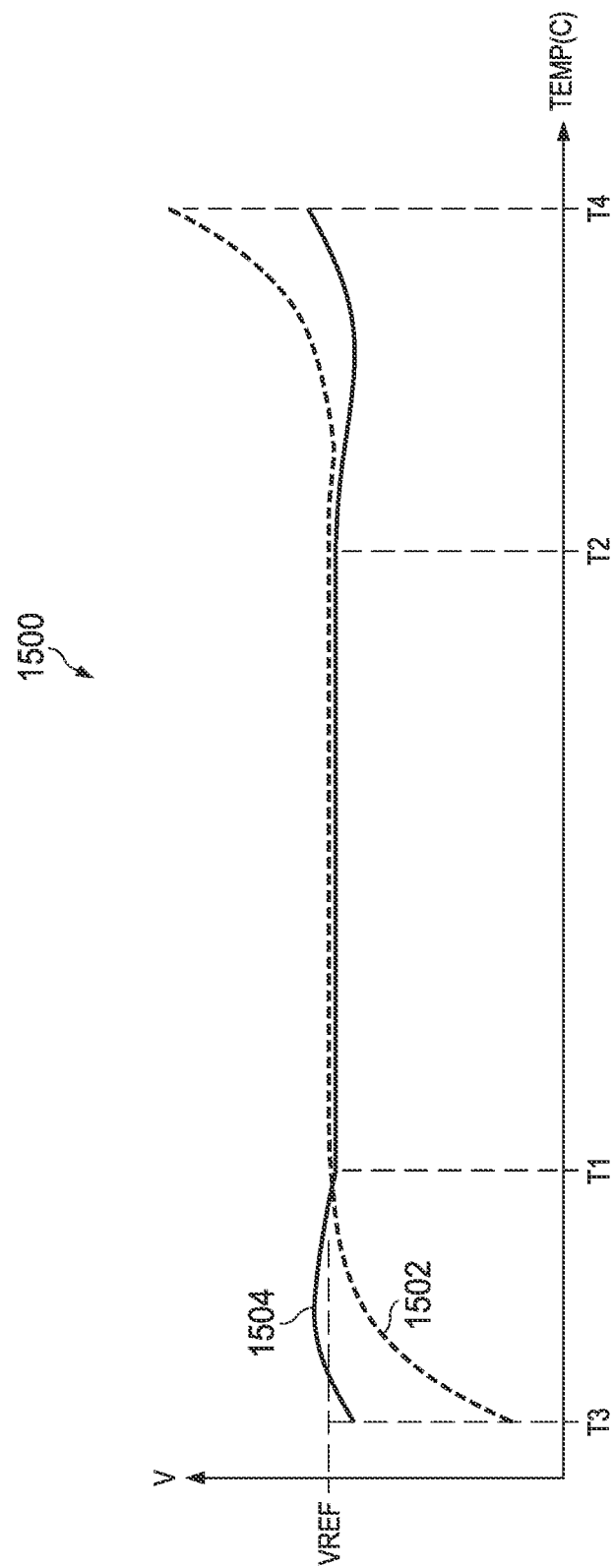
FIG. 15 is a signal diagram showing bandgap reference voltages as a function of temperature.

FIG. 15 is a signal diagram 1500 of bandgap reference voltages VBG 1502 and 1504 as a function of temperature. As shown in the example of FIG. 15, an x-axis of the signal diagram 1500 represents an amplitude axis in volts (V) and a y-axis of the signal diagram 1500 represents a temperature in Celsius (C). The signal diagram 1500 includes a first temperature range from a temperature T1 (e.g., 25 degrees C.) to a temperature T2 (e.g., 90 degrees C.), a second temperature range below T1 to a third temperature T3 (e.g., −25 degrees C.), and a third temperature range that extends above the second temperature T2 to a fourth temperature T4 (e.g., 125 degrees C.). In the example signal diagram 1500, temperature points T1 and T2 can be referred to as knee point temperatures. The bandgap reference voltage VBG 1504 is an example of the bandgap reference voltage VBG, as shown in FIG. 1. Therefore, the following description of FIG. 15 also refers to FIG. 1.

In the signal diagram 1500, the bandgap reference voltage VBG 1502 has not been compensated for higher-order thermal effects. As such, as shown in FIG. 15, the bandgap reference voltage VBG 1502 can deviate in some instances significantly over the second and third temperate ranges from a desired bandgap reference voltage VREF. The bandgap reference voltage VBG 1504 can be an example bandgap reference voltage having corrected 0th, 1st, 2nd, and higher-order thermal effects. As described herein, the piecewise compensation circuit 116 can be configured to compensate for higher-order thermal effects on the bandgap reference voltage VBG provided by the bandgap reference circuit 102. Thus, in the second and third temperature ranges, as shown in FIG. 15, the bandgap reference voltage VBG 1504 can have an amplitude that more closely tracks the desired bandgap reference voltage VREF in contrast to the bandgap reference voltage VBG 1502.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Modifications are possible in the described embodiments, and other embodiments are possible, within the scope of the claims.

What is claimed is:

1. A circuit comprising:
   a knee code selector configured to set a knee point temperature for a correction current responsive to a respective knee point temperature code of knee point temperature codes and a respective temperature sense signal of temperature sense signals;
   an output circuit configured to provide the correction current responsive to the respective temperature sense signal and temperature voltages; and
   a trim digital to analog converter (DAC) configured to provide a piecewise compensation current responsive to the correction current and a respective trim code of trim codes.

2. The circuit of claim 1, wherein the temperature voltages comprise:
   a first voltage that is proportional to a temperature of a voltage reference device, and
   a second voltage that is complementary to the temperature of the voltage reference device, and wherein the respective temperature sense signal is generated responsive to one of the first voltage and the second voltage.

3. The circuit of claim 2, wherein the knee code selector comprises:
   a switching network; and
   a transistor having a control terminal, an input terminal, and an output terminal, the control terminal configured to receive respective temperature sense signal, the input terminal configured to receive a current bias, and the output terminal configured to provide the current bias to the switching network responsive to the control terminal receiving the respective temperature sense signal.

4. The circuit of claim 3, further comprising a resistor chain comprising resistors coupled in series, the switching network comprising switches, in which each of the switches is coupled in parallel with a respective resistor of the resistors of the resistor chain and activated responsive to a respective switch control signal to control the bias current provided to the output circuit, wherein the output circuit is configured to provide the correction current further responsive to the bias current.

5. The circuit of claim 4, wherein the respective switch control signal is generated responsive to the respective knee point temperature code of the knee point temperature codes.

6. The circuit of claim 5, wherein the switching network is a first switching network, and the transistor is a first transistor having a first control terminal, a first input terminal and a first output terminal, the respective temperature sense signal is a first temperature sense signal of the temperature sense signals, wherein the knee code selector comprises:
a second switching network; and
a second transistor having a control terminal, an input terminal, and an output terminal, the control terminal of the second transistor configured to receive a second temperature sense signal of the temperature sense signals, the input terminal of the second transistor configured to receive the current bias, and the output terminal of the second transistor configured to provide the current bias to the second switching network responsive to the control terminal of the second transistor receiving the second temperature sense signal.

7. The circuit of claim 6, wherein the respective switch control signal is a first respective switch control signal, the second switching network comprising switches, in which each of the switches of the second switching network is coupled in parallel with the respective resistor of the resistors of the resistor chain and activated responsive to a second respective switch control signal to control the bias current provided to the output circuit.

8. The circuit of claim 7, wherein the respective knee point temperature code is a first knee point temperature code of the knee point temperature codes, and the second respective switch control signal is generated responsive to a second knee point temperature code of the knee point temperature codes.

9. The circuit of claim 8, wherein the piecewise compensation current is a first piecewise compensation current and the trim code comprises a first trim code and a second trim code, wherein the trim DAC comprises first transistors and second transistors,
wherein the first transistors are configured to provide the first piecewise compensation current responsive to the first trim code, the correction current, and the first temperature sense signal, and the second transistors are configured to provide a second piecewise compensation current responsive to the second trim code, the correction current, and the second temperature sense signal.

10. A system comprising:
a piecewise compensation circuit comprising:
a knee code selector configured to set a knee point temperature for a correction current responsive to a respective knee point temperature code of knee point temperature codes and a respective temperature sense signal of temperature sense signals;
an output circuit configured to provide the correction current responsive to the respective temperature sense signal and temperature voltages; and
a trim digital to analog converter (DAC) configured to provide a piecewise compensation current responsive to the correction current and a respective trim code of trim codes; and
a bandgap reference circuit configured to provide a bandgap reference voltage at an output terminal responsive to the piecewise compensation current.

11. The system of claim 10, wherein the piecewise compensation circuit is a piecewise linear (PWL) compensation generator circuit, and the knee code selector is a first knee code selector, the correction current is a linear correction current, the knee temperature codes are first knee temperature codes, and the piecewise compensation current is a piecewise linear compensation current,
the system further comprising a piecewise non-linear (PWNL) compensation generator circuit, the PWNL compensation generator circuit comprising:
a second knee code selector configured to set a knee point temperature for a non-linear correction current responsive to a respective knee point temperature code of second knee point temperature codes and the respective temperature sense signal of the temperature sense signals; and
an output circuit configured to provide the non-linear correction current responsive to the respective temperature sense signal and the temperature voltages.

12. The system of claim 11, wherein the trim DAC is a first trim DAC, the trim codes are a first set of trim codes, the system further comprising:
a current squarer configured to generate a squared non-linear correction current responsive to the non-linear correction current,
a second trim DAC configured to provide a piecewise non-linear compensation current responsive to the squared non-linear correction current and a respective trim code of a second set of trim codes.

13. The system of claim 12, further comprising a summing circuit configured to sum the piecewise linear and non-linear compensation currents to provide a piecewise linear and non-linear compensation current, wherein the bandgap reference circuit is configured to provide the bandgap reference voltage based on the piecewise linear and non-linear compensation currents.

14. The system of claim 13, further comprising an analog to digital converter (ADC), the ADC configured to receive the bandgap reference voltage and process an analog input voltage relative to the bandgap reference voltage to provide a digital input voltage of the analog input voltage.

15. A circuit comprising:
a knee code selector circuit having a first bias current input, a second current bias input, knee code inputs, and first and second knee point current outputs, the first bias current input adapted to be coupled to a first current source and the second bias current input adapted to be coupled to a second current source, the knee code inputs are coupled to a respective output of a respective knee code storage circuit or register;
an output circuit having a first current bias input, a second current bias input, and a current output, the first current bias input of the output circuit coupled to the first knee point current output, the second current bias input of the output circuit coupled to the second knee point current output; and a trim digital to analog converter (DAC) having a trim input, the trim input coupled to the current output of the output circuit.

16. The circuit of claim 15, wherein the trim DAC has trim code inputs and a trim output, the trim code inputs are coupled to a respective output of a respective trim code storage circuit or register and the trim output is coupled to an input of a bandgap reference circuit.

17. The circuit of claim 16, wherein the knee code selector circuit is a first knee code selector circuit, the output circuit is a first output circuit, and the trim DAC is a first trim DAC, the circuit further comprising a piecewise linear (PWL) compensation generator circuit and a piecewise non-linear (PWNL) compensation generator circuit, the PWL compensation generator circuit comprising the first knee code selector circuit and the first output circuit, and the PWNL compensation generator circuit comprising:
a second knee code selector circuit having a first bias current input, a second bias current input, knee code inputs and knee point current outputs, the first bias current input of the second knee code selector circuit adapted to be coupled to a third current source and the second bias current input of the second knee code selector circuit adapted to be coupled to a fourth current source, the knee code inputs of the second knee code selector circuit are coupled to the respective output of the respective knee code storage circuit or register;

a second output circuit having a first current bias input, a second current bias input, and a current output, the first current bias input of the second output circuit coupled to the first knee point current output of the second knee code selector circuit, the second current bias input of the second output circuit is coupled to the second knee point current output of the second knee code selector circuit; and a second trim DAC having a trim input and a trim output, the trim input of the second trim DAC coupled to the current output of the second output circuit and the trim output of the second trim DAC coupled to the input of the bandgap reference circuit.

18. The circuit of claim 17, wherein the respective trim code storage circuit or register is a respective first trim code storage circuit or register, the second trim DAC further comprises trim code inputs, and the trim code inputs of the second trim DAC are coupled to a respective output of a respective second trim code storage circuit or register.

19. The circuit of claim 18, wherein the first output circuit comprises first temperature voltage inputs and the second output circuit comprises second temperature voltage inputs, the first and second temperature voltage inputs are coupled to a respective temperature voltage output of a two-temperature trim DAC.

20. The circuit of claim 19, wherein the first knee code selector circuit further comprises first temperature sense inputs, the second knee code selector circuit comprises second temperature sense inputs, the first output circuit comprises third temperature sense inputs, and the second output circuit comprises fourth temperature sense inputs, the circuit further comprising a temperature sense generation circuit comprising temperature sense outputs coupled to a respective temperature sense input of the first, second, third, and fourth temperature sense inputs.

* * * * *